United States Patent
Bergmann et al.

(10) Patent No.: US 9,240,528 B2
(45) Date of Patent: Jan. 19, 2016

(54) SOLID STATE LIGHTING APPARATUS WITH HIGH SCOTOPIC/PHOTOPIC (S/P) RATIO

(71) Applicant: Cree, Inc., Durham, NC (US)

(72) Inventors: Michael Bergmann, Raleigh, NC (US); James Ibbetson, Santa Barbara, CA (US); David Clatterbuck, Raleigh, NC (US); Charles Draper, Thomasville, NC (US); Nalini Gupta, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 58 days.

(21) Appl. No.: 14/045,474

(22) Filed: Oct. 3, 2013

(65) Prior Publication Data
US 2015/0097200 A1  Apr. 9, 2015

(51) Int. Cl.
*H01L 29/20* (2006.01)
*H01L 33/50* (2010.01)
(Continued)

(52) U.S. Cl.
CPC ............ *H01L 33/50* (2013.01); *H01L 25/0753* (2013.01); *H01L 33/504* (2013.01); *H01L 33/54* (2013.01); *H01L 2224/48091* (2013.01);
(Continued)

(58) Field of Classification Search
CPC ............... H01L 2924/00; H01L 2224/48901; H01L 33/507; H01L 33/62; H01L 33/54
USPC ............................................... 257/89; 438/28
See application file for complete search history.

(56) References Cited

U.S. PATENT DOCUMENTS

| 4,918,497 A | 4/1990 | Edmond |
| 4,966,862 A | 10/1990 | Edmond |
| 5,027,168 A | 6/1991 | Edmond |

(Continued)

FOREIGN PATENT DOCUMENTS

| DE | 10233050 A1 | 2/2004 |
| EP | 2489717 A1 | 8/2012 |

(Continued)

OTHER PUBLICATIONS

"Boeing lighting project may help astronauts sleep," The Philadelphia Inquirer. (Jul. 29, 2012) Retreived from http://heraldnet.com/article/20120729/NEWS02/707299898/0/Search.

(Continued)

*Primary Examiner* — Andy Huynh
(74) *Attorney, Agent, or Firm* — Withrow & Terranova, P.L.L.C.; Vincent K. Gustafson

(57) ABSTRACT

Solid state light emitting apparatuses include blue LEDs (e.g., including short wavelength and long wavelength blue LEDs in combination) to stimulate green lumiphors, with supplemental emissions by red lumiphors and/or red solid state light emitters, to provide aggregate emissions with high S/P ratio (e.g., ≥1.95) and high color rendering values (e.g., ≥85), preferably in combination with high brightness and high luminous efficacy. In certain embodiments, a light emitting apparatus may be devoid of a LED having a peak wavelength of from 470-599 nm and/or devoid of lumiphors with peak wavelengths in the yellow range. Multiple LEDs may be arranged in an emitter package. A fabrication method includes mounting multiple solid state emitters (e.g., with a first blue and a second red emitter) to a common substrate, applying a stencil or mask over the second emitter, applying a lumiphoric material over the first emitter, and removing the stencil or mask.

26 Claims, 21 Drawing Sheets

(51) Int. Cl.
*H01L 25/075* (2006.01)
*H01L 33/54* (2010.01)
(52) U.S. Cl.
CPC ............. *H01L2224/48465* (2013.01); *H01L 2224/49175* (2013.01); *H01L 2933/0041* (2013.01)

(56) References Cited

U.S. PATENT DOCUMENTS

| | | |
|---|---|---|
| 5,210,051 A | 5/1993 | Carter, Jr. |
| 5,338,944 A | 8/1994 | Edmond et al. |
| 5,359,345 A | 10/1994 | Hunter |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,252,254 B1 | 6/2001 | Soules et al. |
| 6,600,175 B1 | 7/2003 | Baretz et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | van de Ven et al. |
| 7,234,844 B2 | 6/2007 | Bolta et al. |
| 7,456,499 B2 | 11/2008 | Loh et al. |
| 7,564,180 B2 | 7/2009 | Brandes |
| 7,655,957 B2 | 2/2010 | Loh et al. |
| 7,744,242 B2 | 6/2010 | Krämer |
| 7,768,192 B2 | 8/2010 | Van De Ven et al. |
| 7,781,953 B2 | 8/2010 | Su |
| 7,828,460 B2 | 11/2010 | Van De Ven et al. |
| 7,901,107 B2 | 3/2011 | Van De Ven et al. |
| 7,909,479 B2 | 3/2011 | Rooymans |
| 8,125,137 B2 | 2/2012 | Medendorp, Jr. et al. |
| 8,201,966 B2 | 6/2012 | Hall et al. |
| 8,436,556 B2 | 5/2013 | Eisele et al. |
| 8,508,117 B2 * | 8/2013 | Negley et al. ............ 313/501 |
| 8,508,127 B2 * | 8/2013 | Negley et al. ............ 313/512 |
| 8,593,074 B2 | 11/2013 | Hatley et al. |
| 8,698,388 B2 | 4/2014 | Cash |
| 9,030,103 B2 * | 5/2015 | Pickard ............ 315/152 |
| 2004/0218387 A1 | 11/2004 | Gerlach |
| 2006/0149607 A1 | 7/2006 | Sayers et al. |
| 2006/0186418 A1 | 8/2006 | Edmond et al. |
| 2006/0221272 A1 | 10/2006 | Negley et al. |
| 2006/0237636 A1 | 10/2006 | Lyons et al. |
| 2007/0139923 A1 | 6/2007 | Negley et al. |
| 2007/0152797 A1 | 7/2007 | Chemel et al. |
| 2007/0158668 A1 | 7/2007 | Tarsa et al. |
| 2007/0170447 A1 | 7/2007 | Negley et al. |
| 2007/0223219 A1 | 9/2007 | Medendorp, Jr. et al. |
| 2007/0253209 A1 | 11/2007 | Loh et al. |
| 2007/0259206 A1 | 11/2007 | Oshio |
| 2008/0012036 A1 | 1/2008 | Loh et al. |
| 2008/0121921 A1 | 5/2008 | Loh et al. |
| 2008/0173884 A1 | 7/2008 | Chitnis et al. |
| 2008/0179611 A1 | 7/2008 | Chitnis et al. |
| 2008/0198112 A1 | 8/2008 | Roberts |
| 2008/0258130 A1 | 10/2008 | Bergmann et al. |
| 2008/0304260 A1 | 12/2008 | van de Ven et al. |
| 2008/0308825 A1 | 12/2008 | Chakraborty et al. |
| 2009/0046453 A1 | 2/2009 | Kramer |
| 2009/0050907 A1 | 2/2009 | Yuan et al. |
| 2009/0050908 A1 | 2/2009 | Yuan et al. |
| 2009/0080185 A1 | 3/2009 | McMillan |
| 2009/0184616 A1 | 7/2009 | van de Ven et al. |
| 2009/0227847 A1 | 9/2009 | Tepper et al. |
| 2009/0296384 A1 | 12/2009 | Van De Ven et al. |
| 2010/0079059 A1 | 4/2010 | Roberts et al. |
| 2010/0110659 A1 | 5/2010 | Nakajima |
| 2010/0127283 A1 | 5/2010 | van de Ven et al. |
| 2010/0155763 A1 | 6/2010 | Donofrio et al. |
| 2010/0220471 A1 | 9/2010 | Rooymans |
| 2010/0244740 A1 | 9/2010 | Alpert et al. |
| 2010/0254129 A1 | 10/2010 | Le Toquin et al. |
| 2010/0277907 A1 | 11/2010 | Phipps et al. |
| 2011/0220920 A1 | 9/2011 | Collins et al. |
| 2011/0220929 A1 | 9/2011 | Collins et al. |
| 2011/0221330 A1 | 9/2011 | Negley et al. |
| 2012/0306375 A1 | 12/2012 | van de Ven |
| 2013/0092960 A1 | 4/2013 | Wilcox et al. |
| 2013/0114241 A1 | 5/2013 | van de Ven et al. |
| 2014/0228914 A1 | 8/2014 | van de Ven et al. |

FOREIGN PATENT DOCUMENTS

| | | |
|---|---|---|
| JP | 2000022221 A | 1/2000 |
| JP | 2004-071726 A | 3/2004 |
| JP | 2004080046 A | 3/2004 |
| JP | 2005-005482 A | 1/2005 |
| JP | 2005244226 A | 9/2005 |
| JP | 2006-245443 A | 9/2006 |
| JP | 2006-261702 A | 9/2006 |
| JP | 2007173557 A | 7/2007 |
| JP | 2007-258620 A | 10/2007 |
| JP | 2007-266579 A | 10/2007 |
| JP | 2009152213 A | 7/2009 |
| WO | 9748138 A2 | 12/1997 |
| WO | 0033390 A1 | 6/2000 |
| WO | 0034709 A1 | 6/2000 |
| WO | 0141215 A1 | 6/2001 |
| WO | WO 2006/132533 A2 | 12/2006 |
| WO | WO 2008/053012 A1 | 5/2008 |
| WO | 2009013317 A1 | 1/2009 |
| WO | 2009041171 A1 | 4/2009 |

OTHER PUBLICATIONS

"White Paper: Better Vision with LED lights: Scotopic and Photopic Lumens", My LED Lighting Guide. 8 pages. (2008-2011).
Allen, M. and Dobson, J., "Spectrally Enhanced Lighting," 2011 USACE Infrastructure Systems Conference. Jun. 15, 2011.
Josefowicz, J. and Ha, D. "Vision & Exterior Lighting: Shining Some Light on Scotopic & Photopic Lumens in Roadway Conditions," LED Roadway Lighting Ltd. 12 pages (2009).
Nizamoglu et al., "High scotopic/photopic ratio white-light-emitting diodes integrated with semiconductor nanophosphors of colloidal quantum dots," Optics Letters vol. 36 No. 10 pp. 1893-1895 (2011).
Unpublished U.S. Appl. No. 13/763,579, filed Feb. 8, 2013.
Unpublished U.S. Appl. No. 13/763,576, filed Feb. 8, 2013.
Unpublished U.S. Appl. No. 13/796,954, filed Mar. 12, 2013.
Author Unknown, "Cree XLamp MT-G EasyWhite LEDS," Product Family Data Sheet/Binning and Labeling Document, CLD-DS36, Revision 6C, Cree, Inc., 2013, 17 pages.
Author Unknown, "LED Color Mixing: Basics and Background," Technical Article, CLD-AP38, Revision 1, Cree, Inc., 2013, 24 pages.
Narukawa, Yukio, "White-Light LEDs," Optics and Photonics News, Apr. 2004, Optical Society of America, pp. 25-29.
Pascale, Danny, "A Review of RGB Color Spaces," The BabelColor Company, Oct. 2003, Montreal, Canada, 35 pages.

* cited by examiner

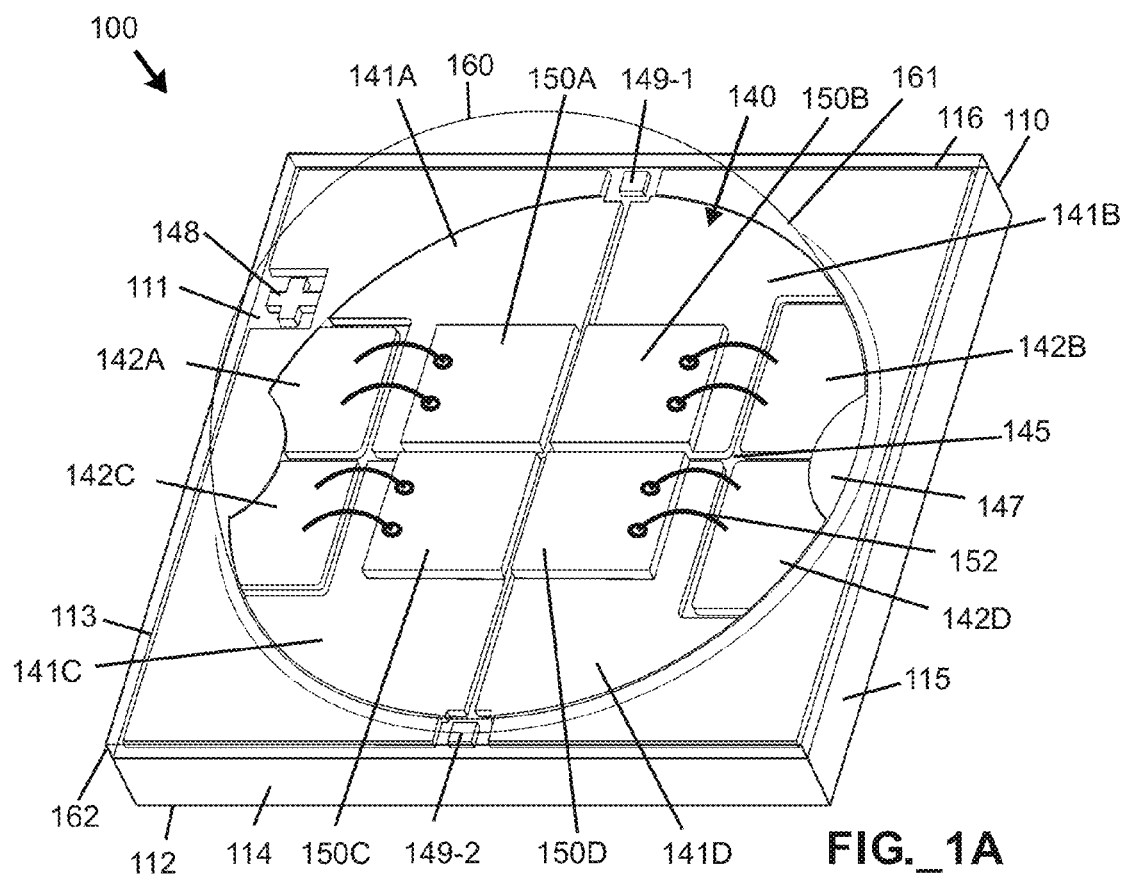
FIG._1A
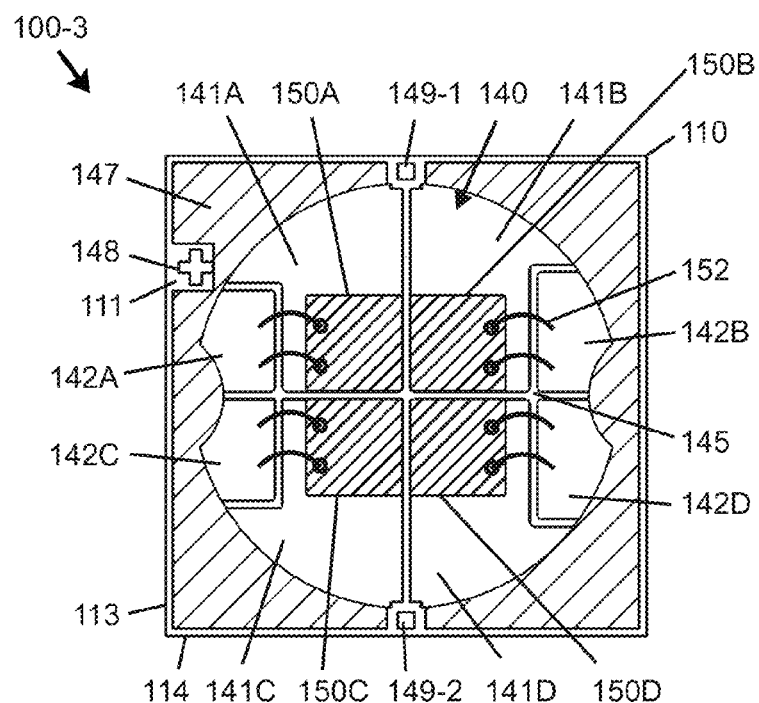
FIG._1B

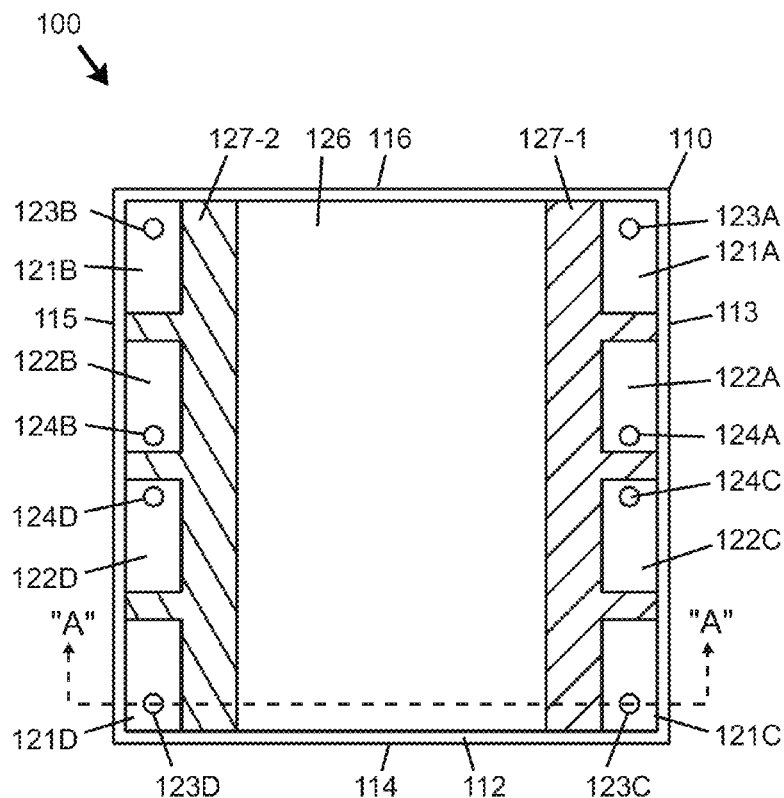
FIG._1E
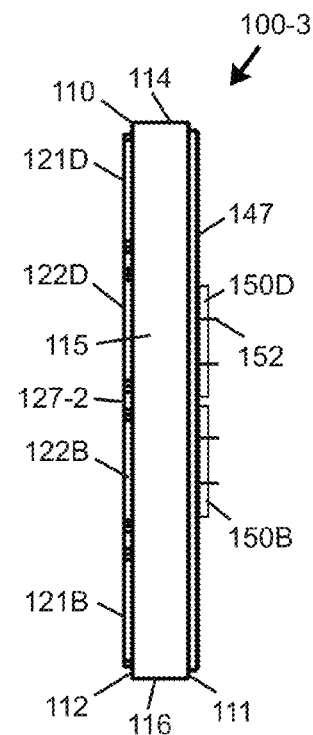
FIG._1F
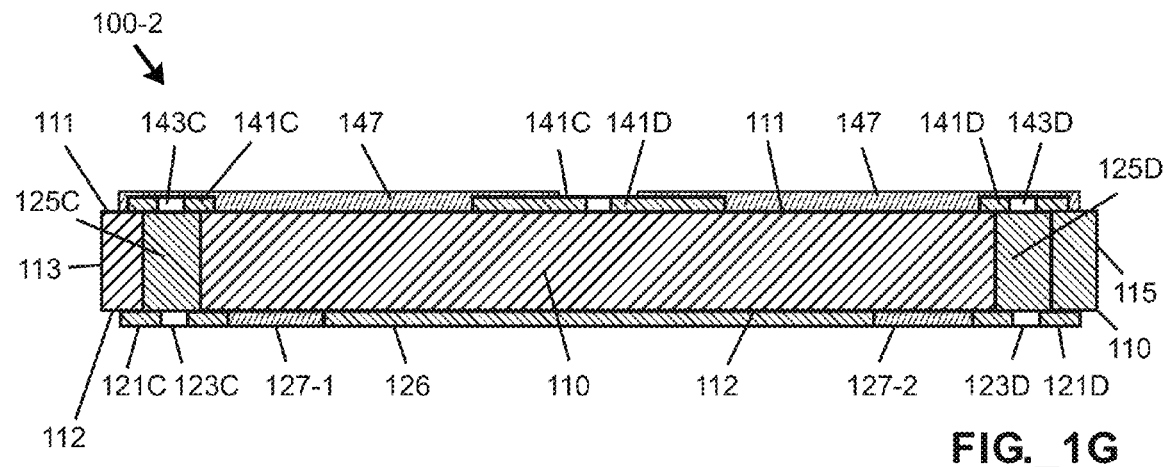
FIG._1G

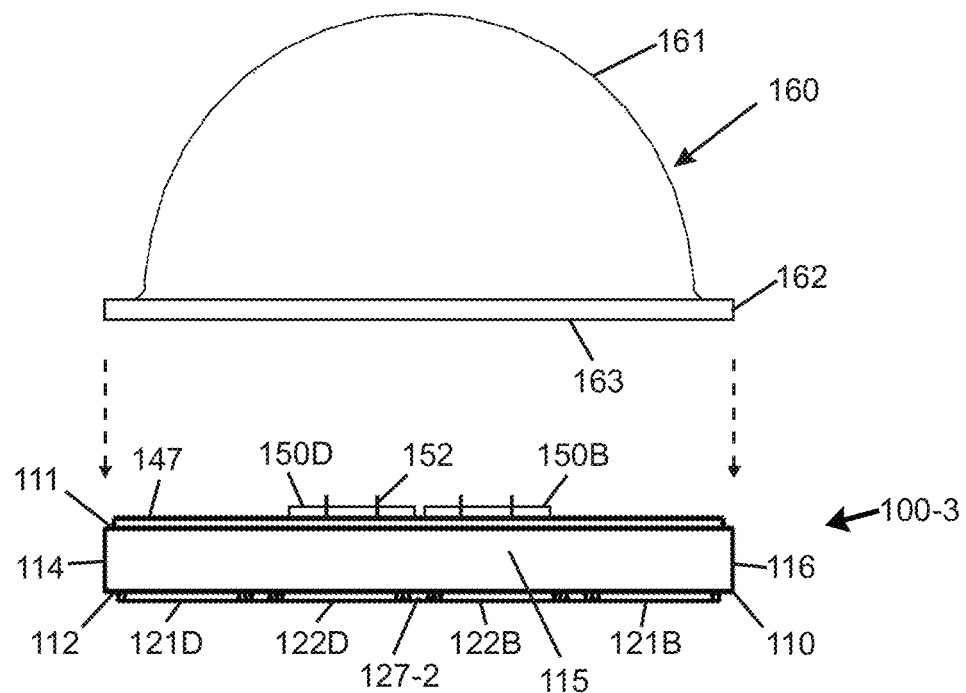
FIG._1H
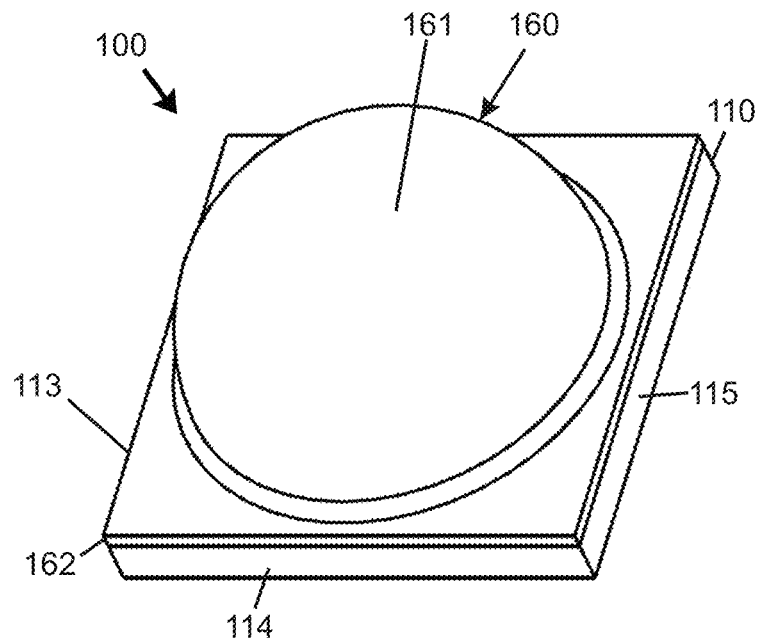
FIG._1I

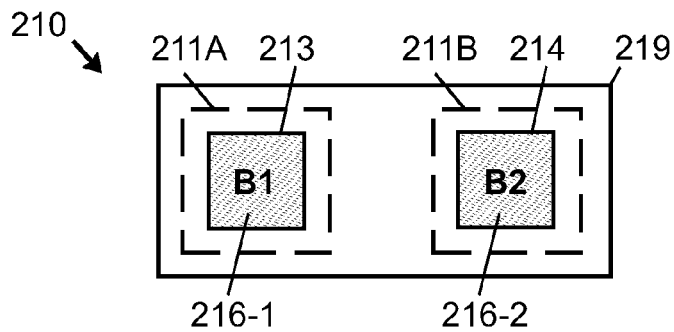
FIG._2A
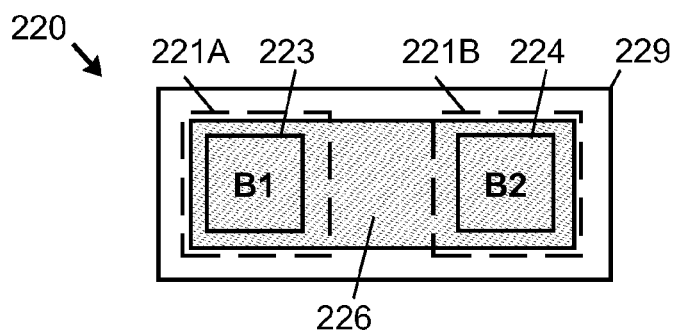
FIG._2B
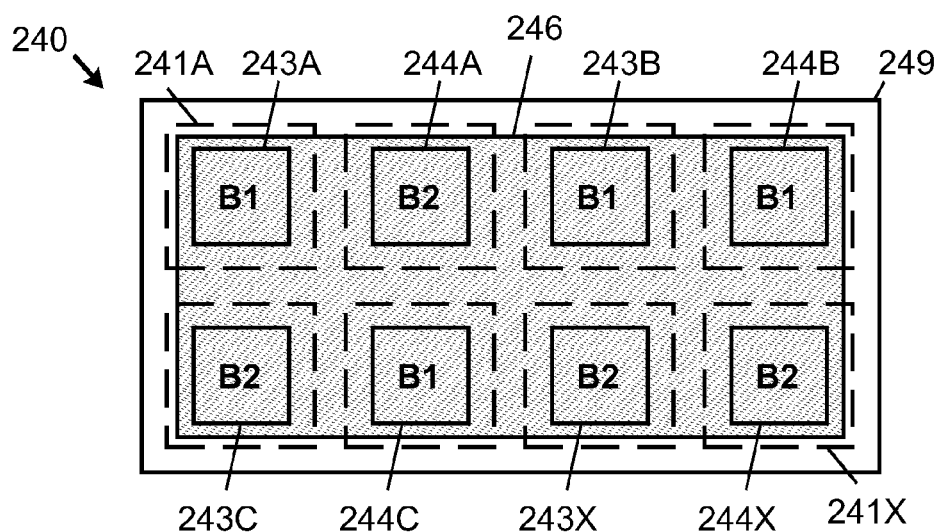
FIG._2C
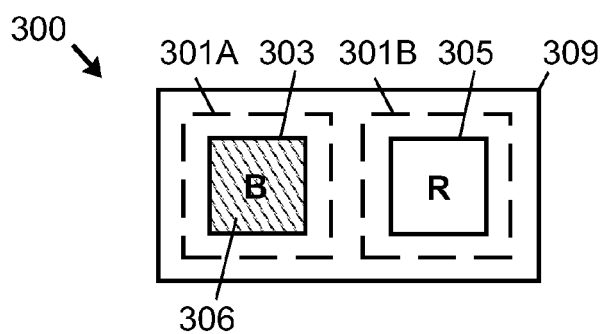
FIG._3A

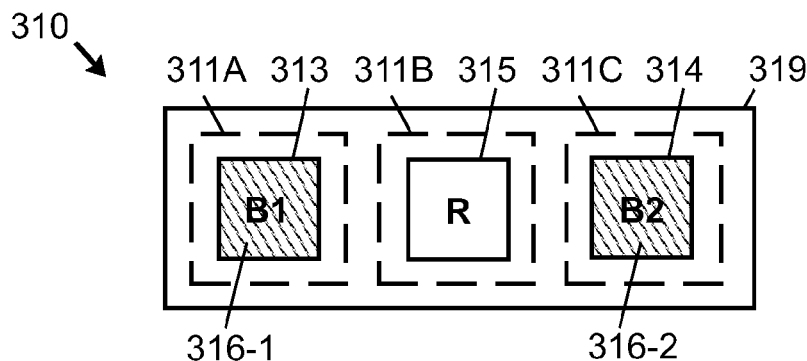
FIG._3B
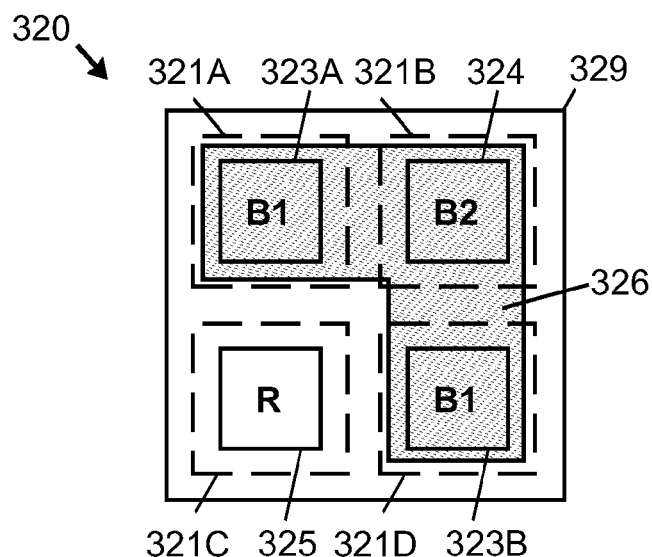
FIG._3C
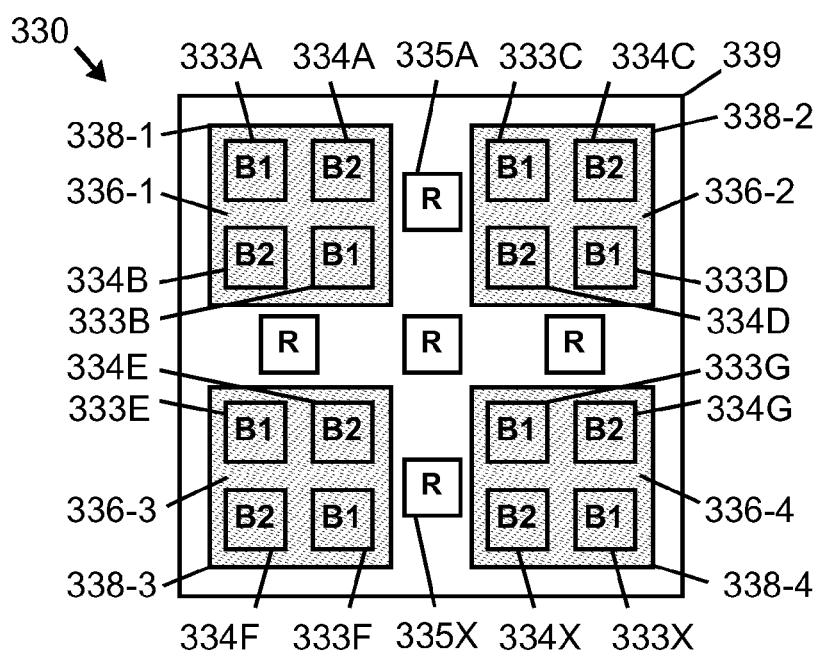
FIG._3D

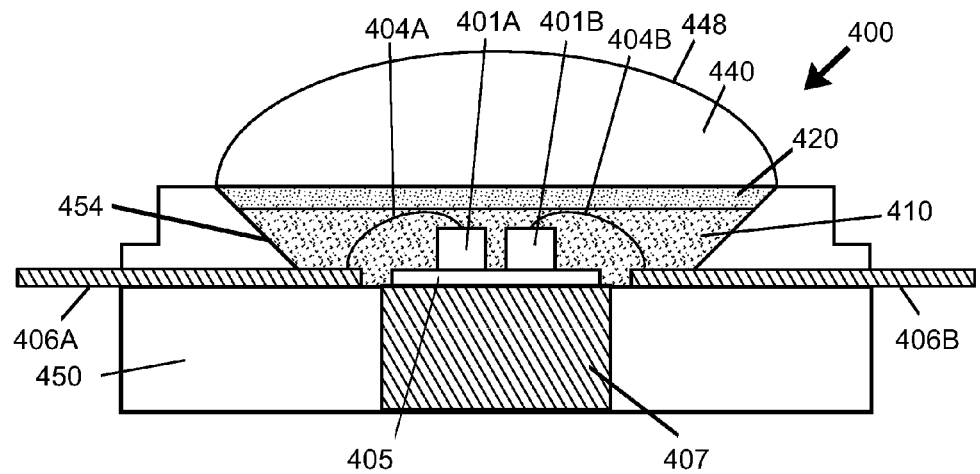
FIG._4
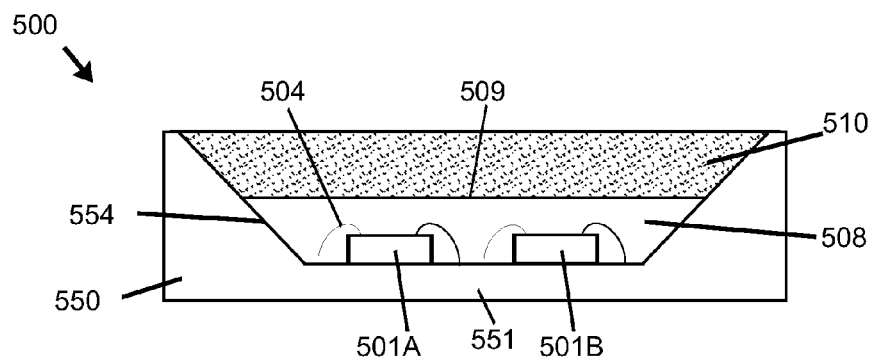
FIG._5A
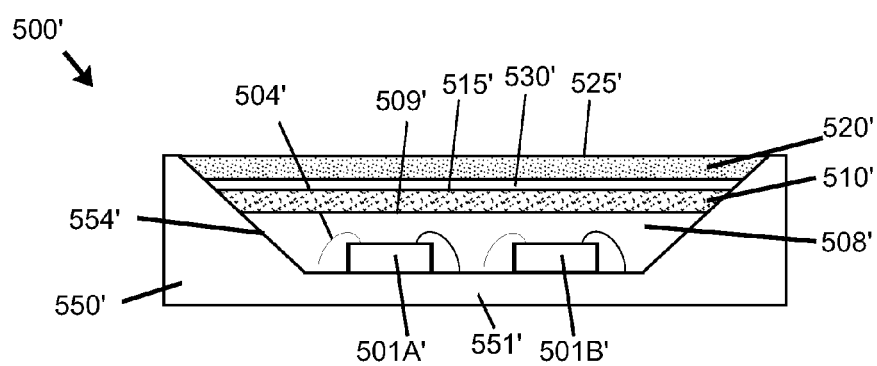
FIG._5B

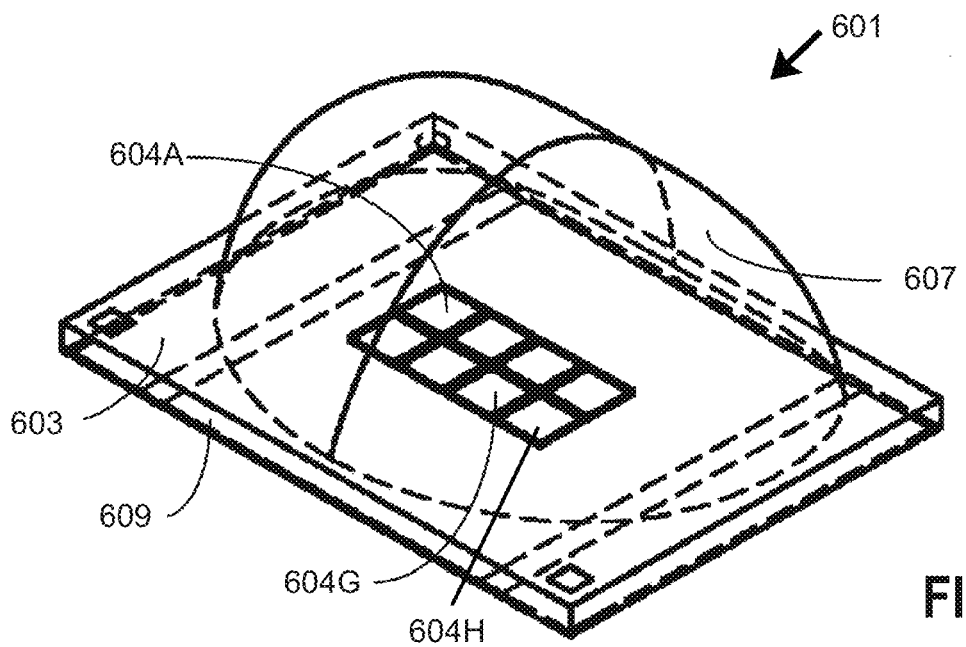
FIG._6A
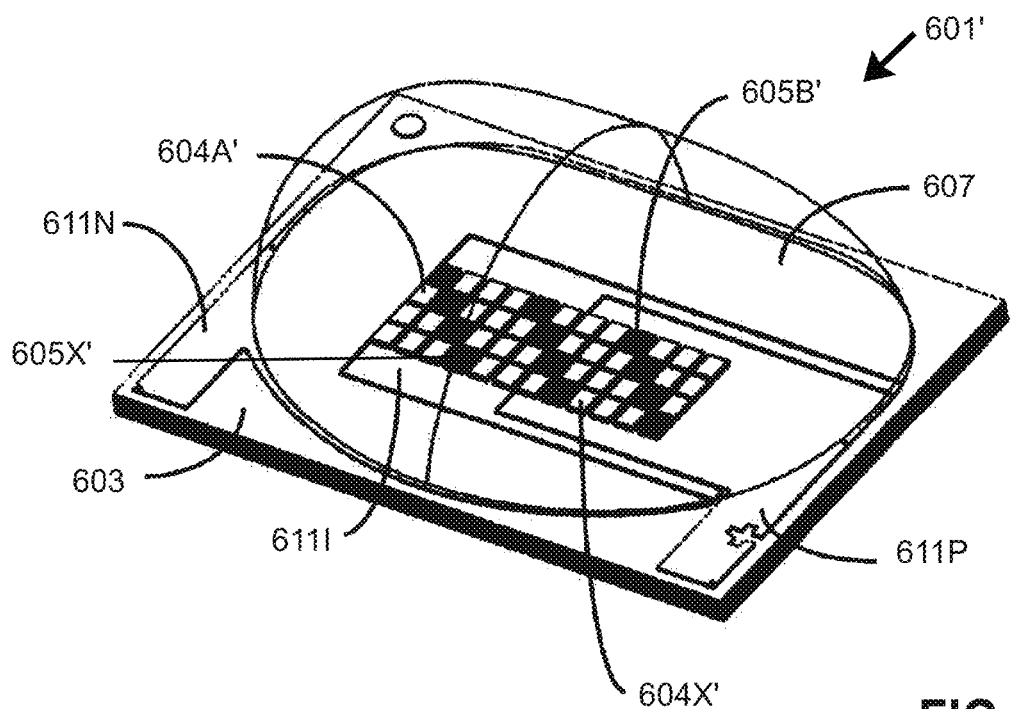
FIG._6B

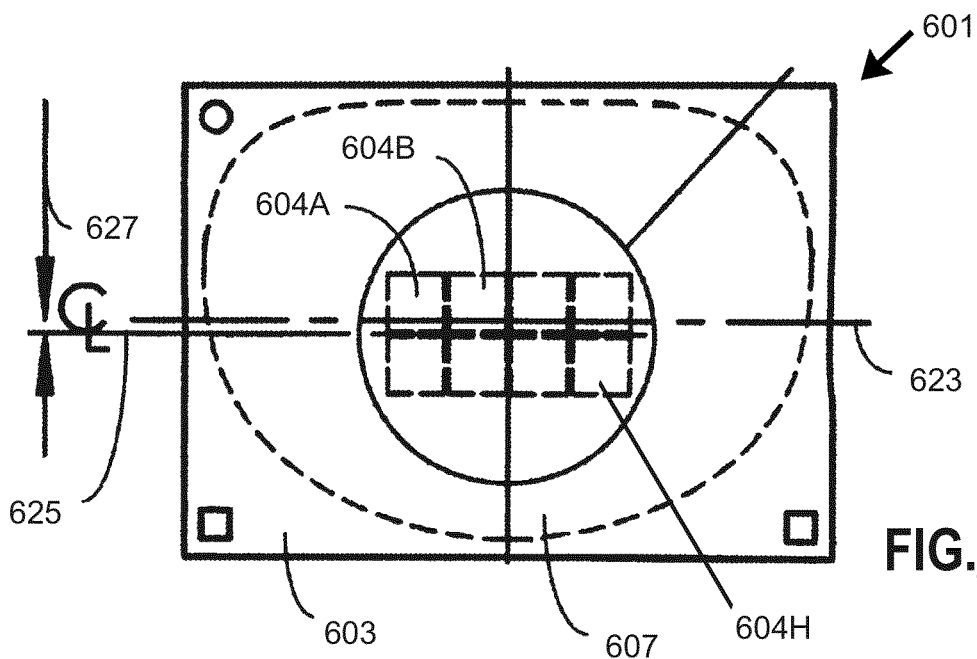
FIG._6C
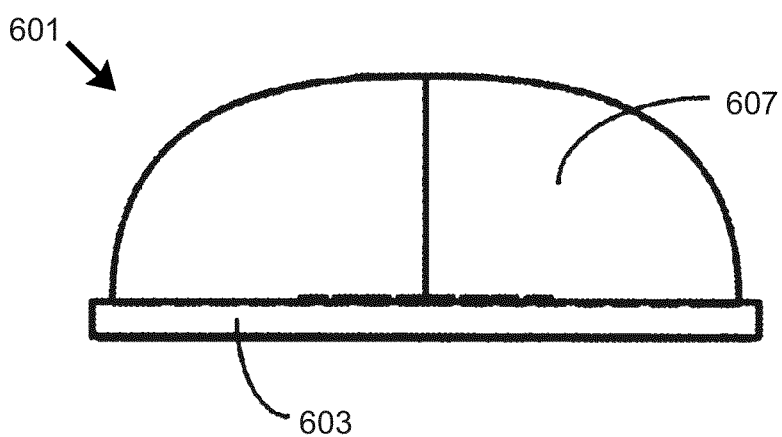
FIG._6D
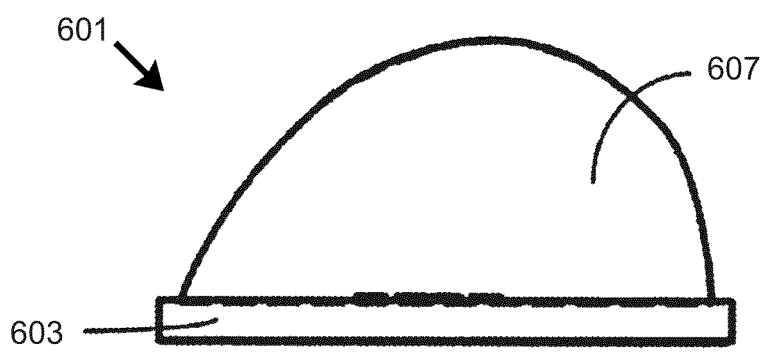
FIG._6E

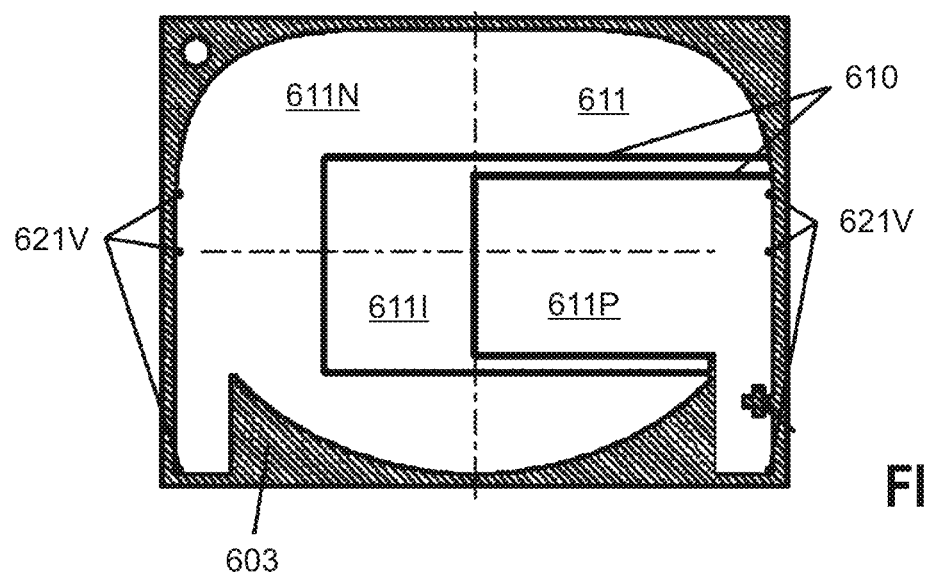
FIG. _6F
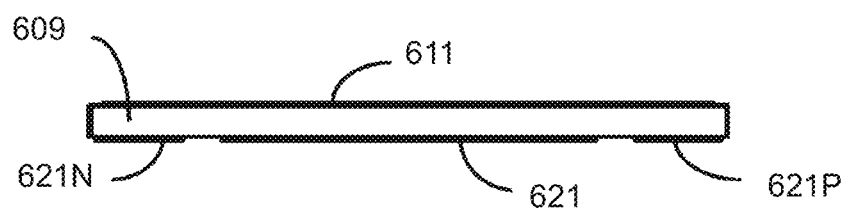
FIG. _6G
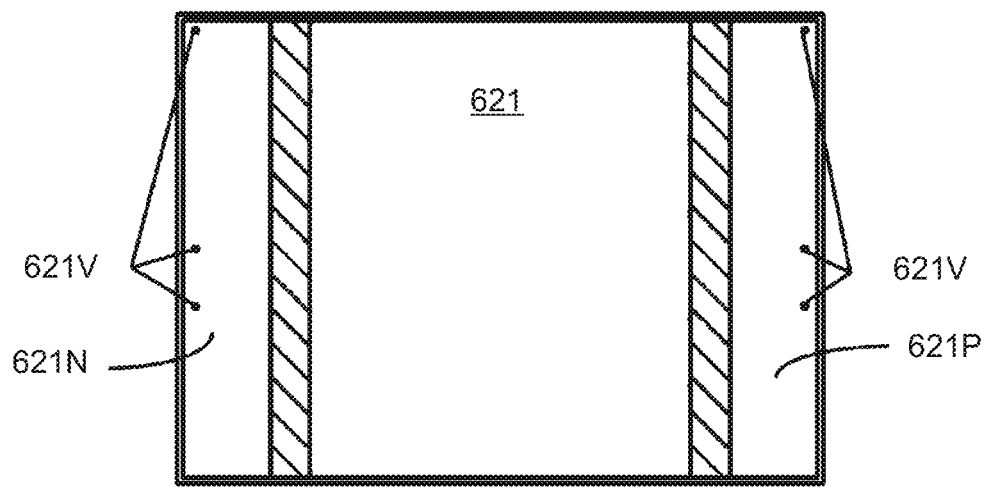
FIG. _6H

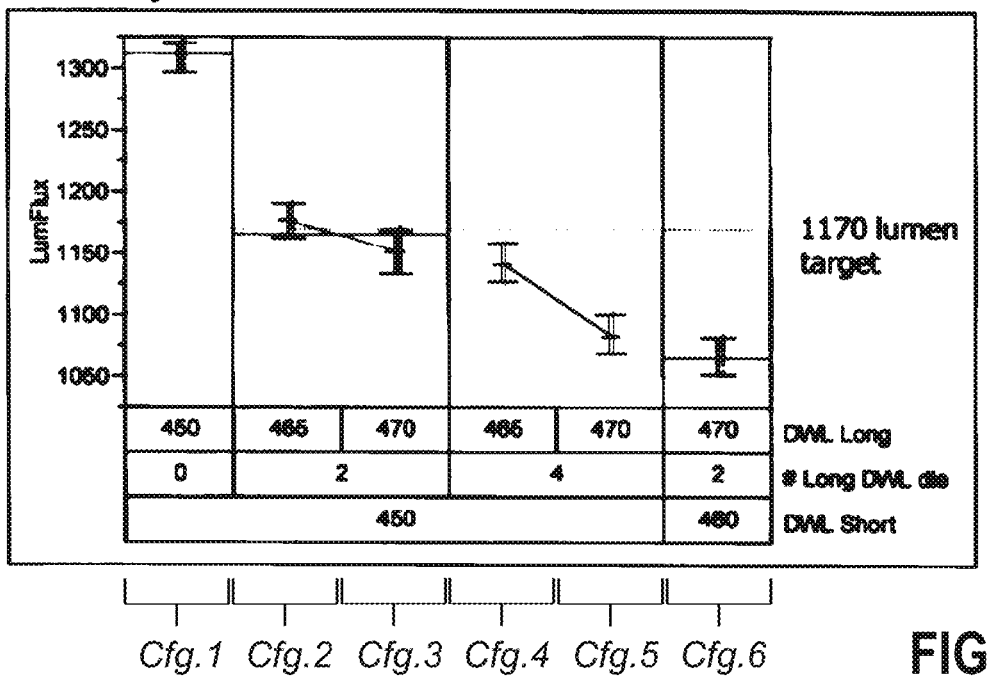
FIG._7A
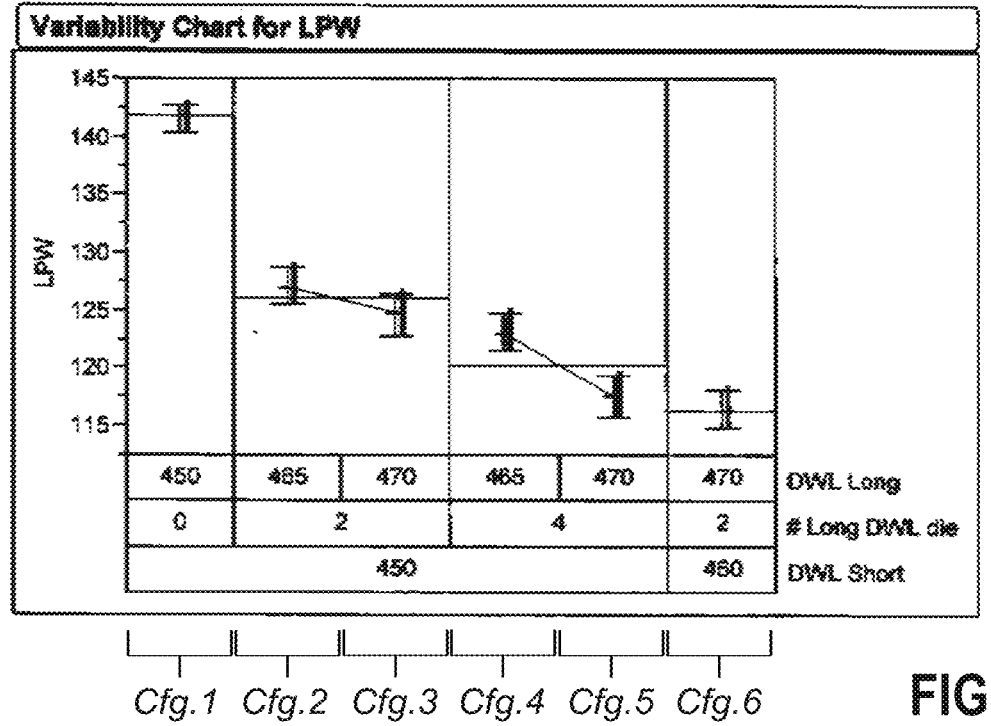
FIG._7B

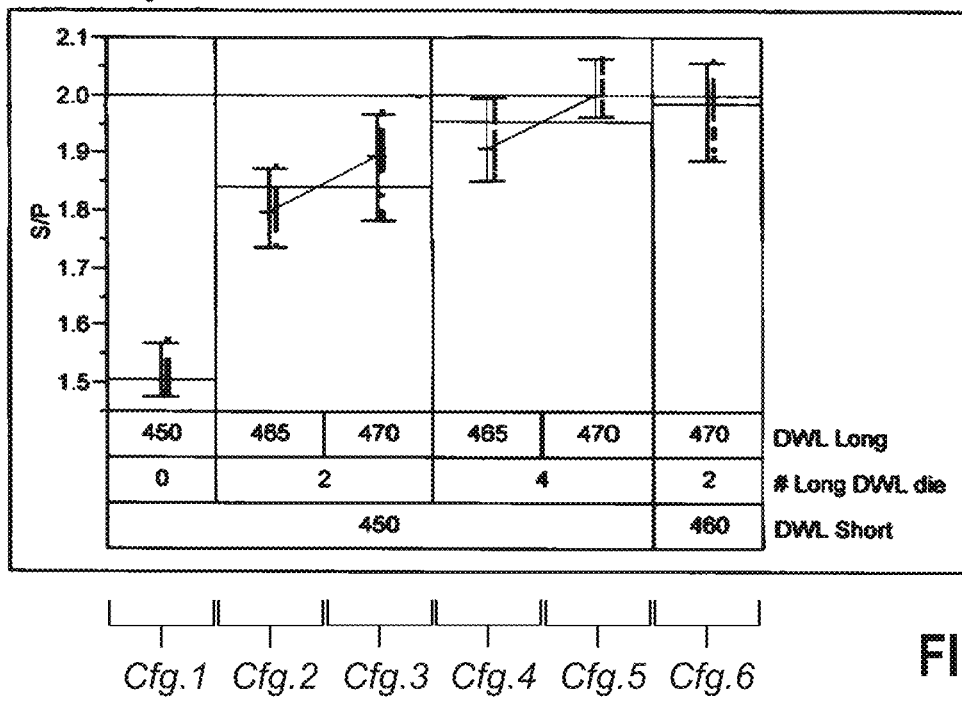
FIG._7C
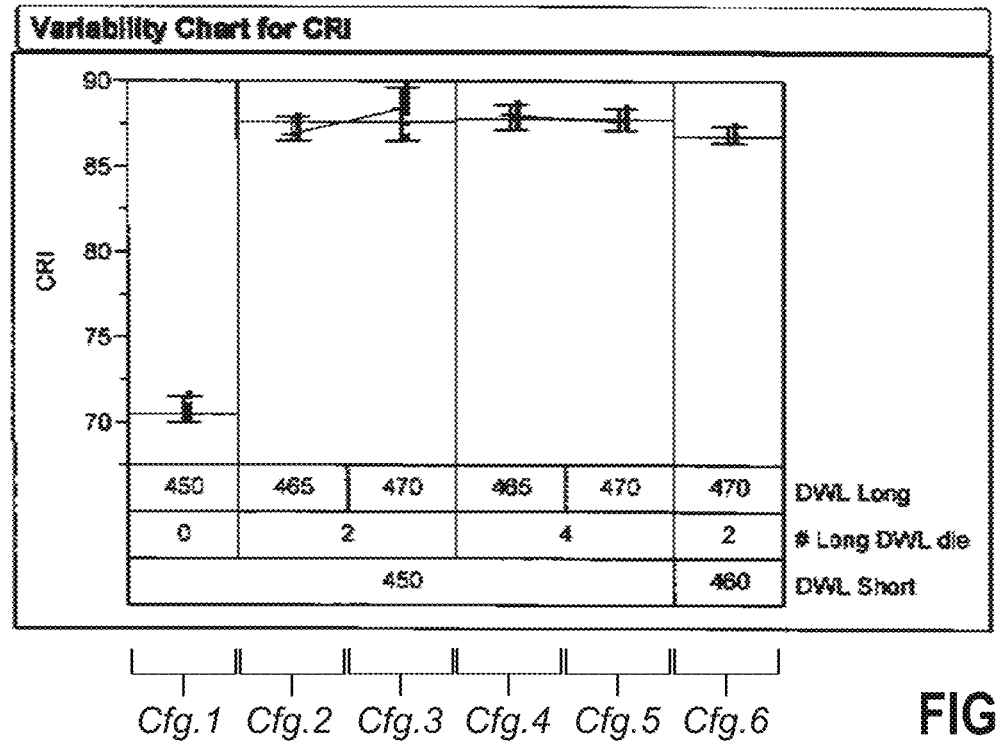
FIG._7D

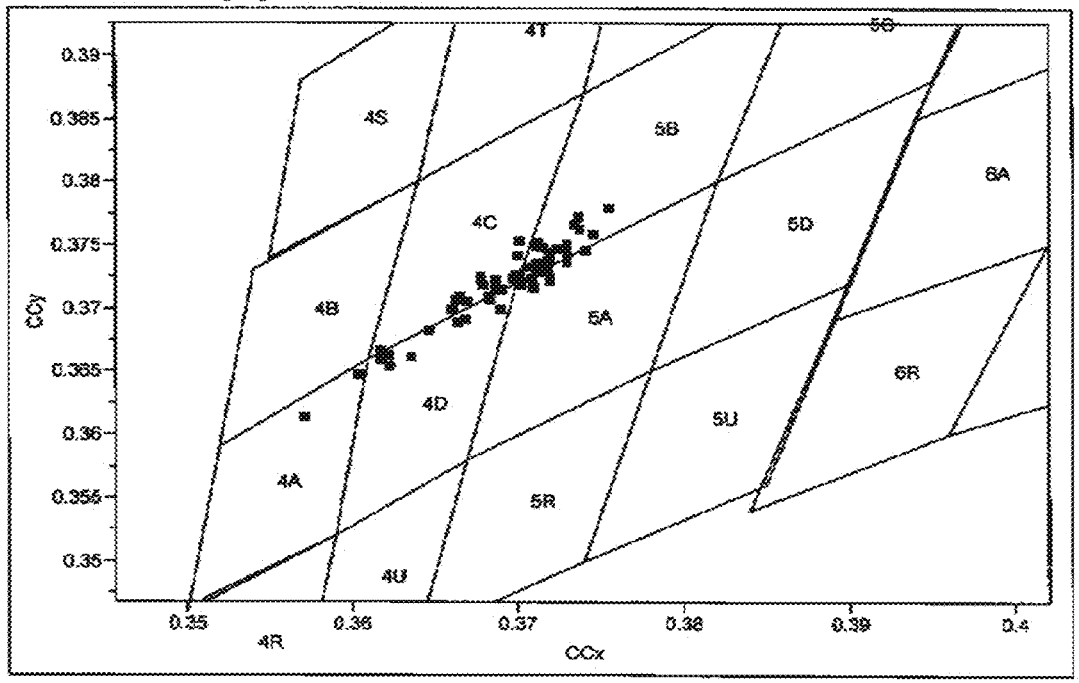
FIG._7E
| DIE POSITIONS: 2 LWB, 6 SWB | | | |
|---|---|---|---|
| A | B | C | D |
| E | F | G | H |
FIG._7F
| DIE POSITIONS: 4 LWB, 4 SWB | | | |
|---|---|---|---|
| A | B | C | D |
| E | F | G | H |
FIG._7G

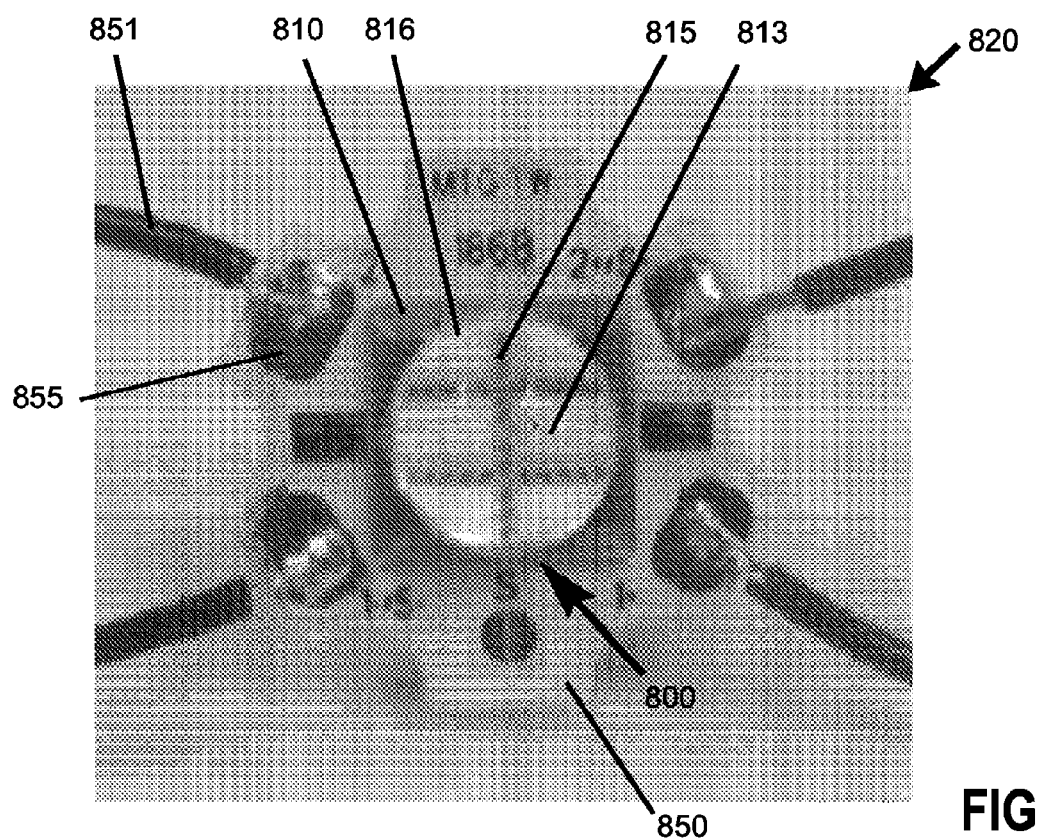
FIG._8A
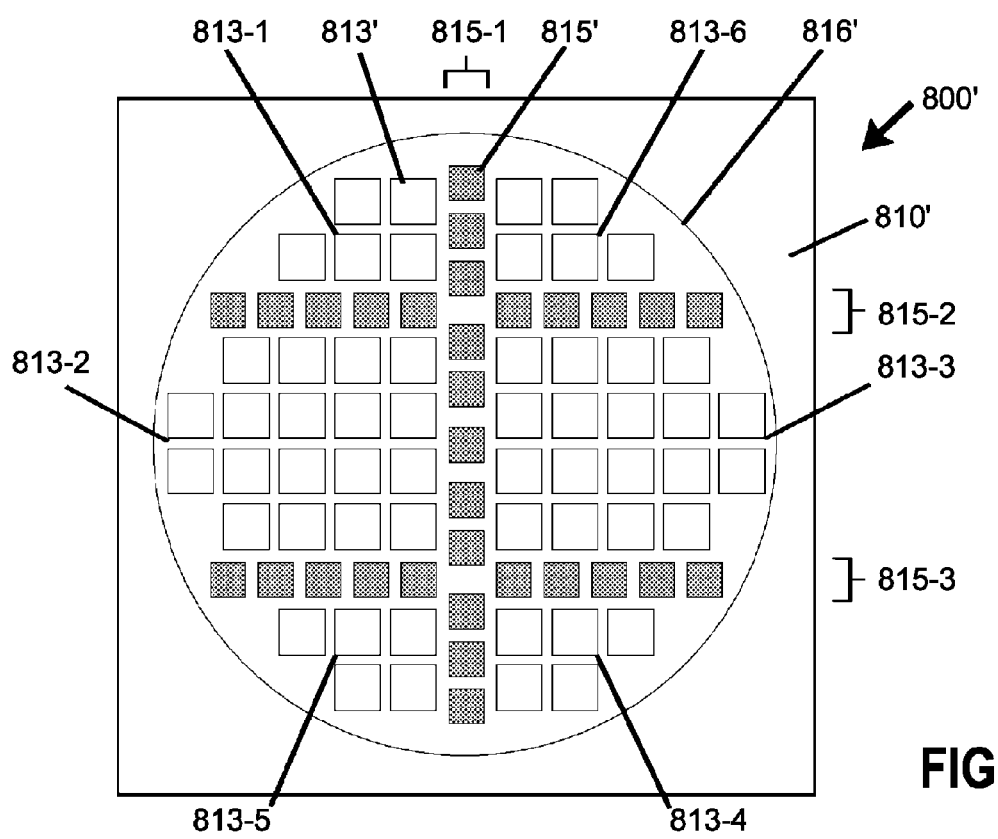
FIG._8B

| Lamp # | Lm | S/P | LPW | LER | CCT | CRI | Ccx | Ccy |
|---|---|---|---|---|---|---|---|---|
| 1 | 1055 | 1.99 | 121 | 339 | 4160 | 89.2 | 0.373 | 0.371 |
| 2 | 1056 | 1.99 | 121 | 339 | 4150 | 89.3 | 0.374 | 0.371 |
| 3 | 1058 | 1.96 | 121 | 343 | 5100 | 89.4 | 0.377 | 0.377 |
FIG._8C
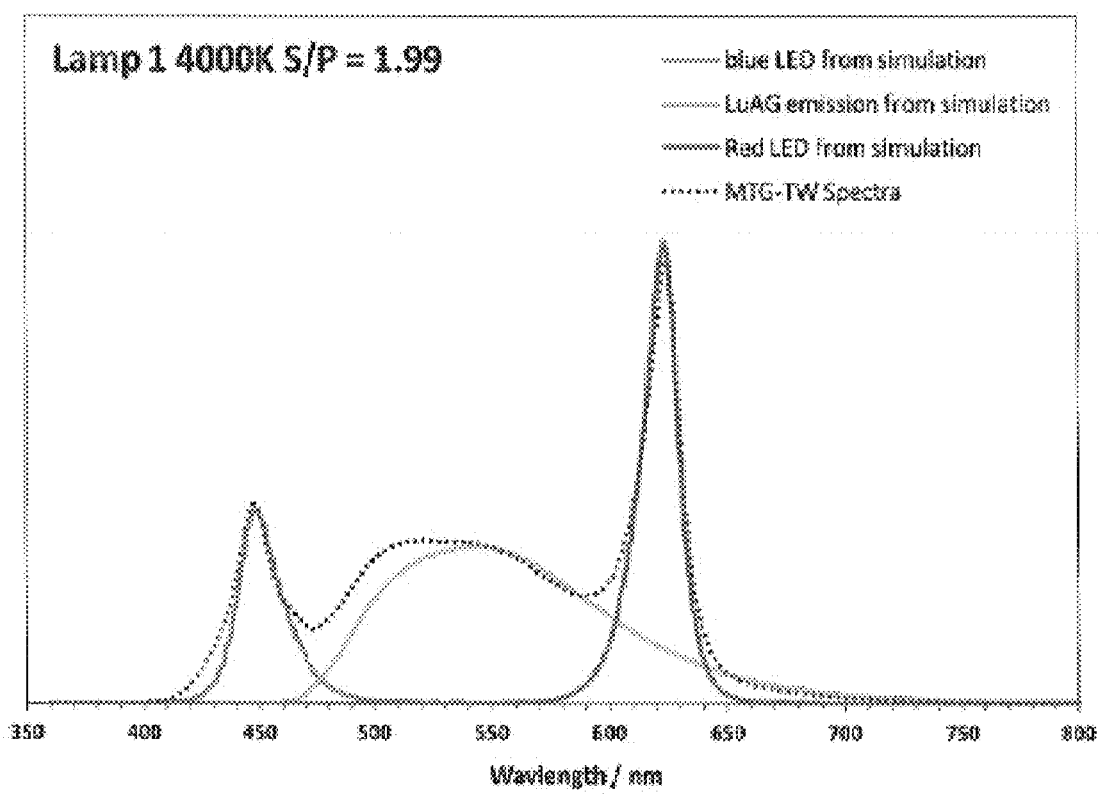
FIG._8D

| Temp | Lm | S/P | LPW | LER | CCT | CRI |
|---|---|---|---|---|---|---|
| 25℃ | 1010 | 1.96 | 115.6 | 342 | 4100 | 89.6 |
| 85℃ | 855 | 2.06 | 87.8 | 316 | 4200 | 83.1 |
FIG._8E
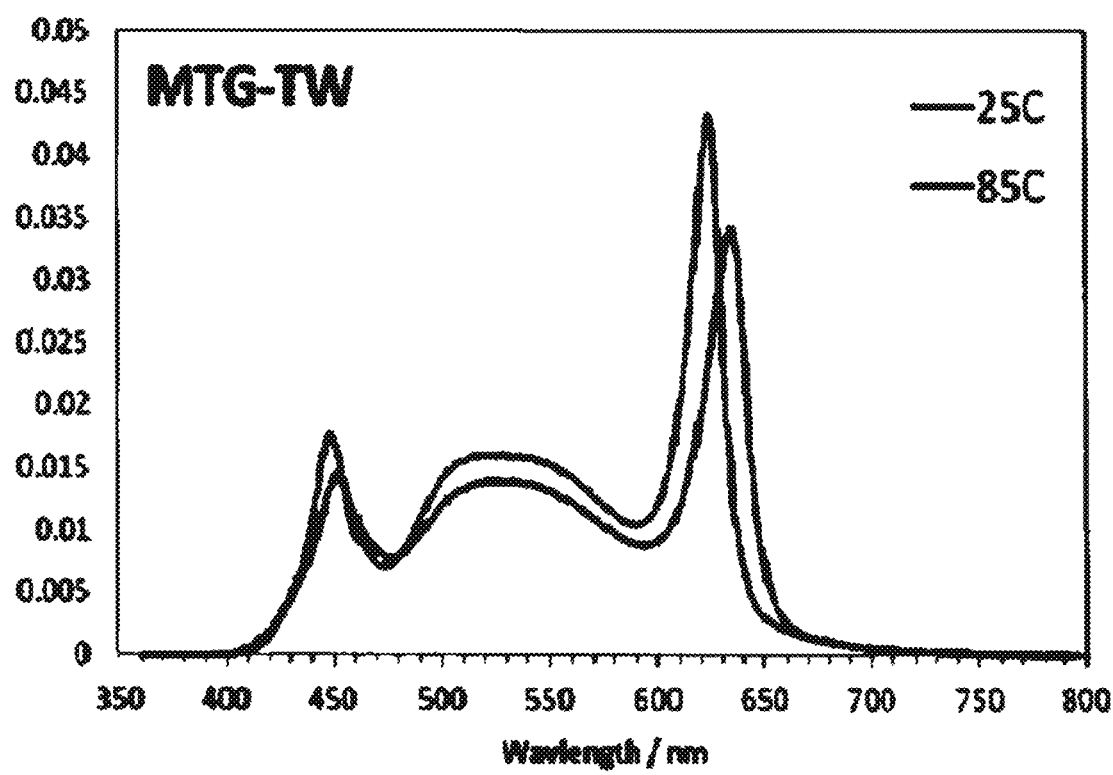
FIG._8F

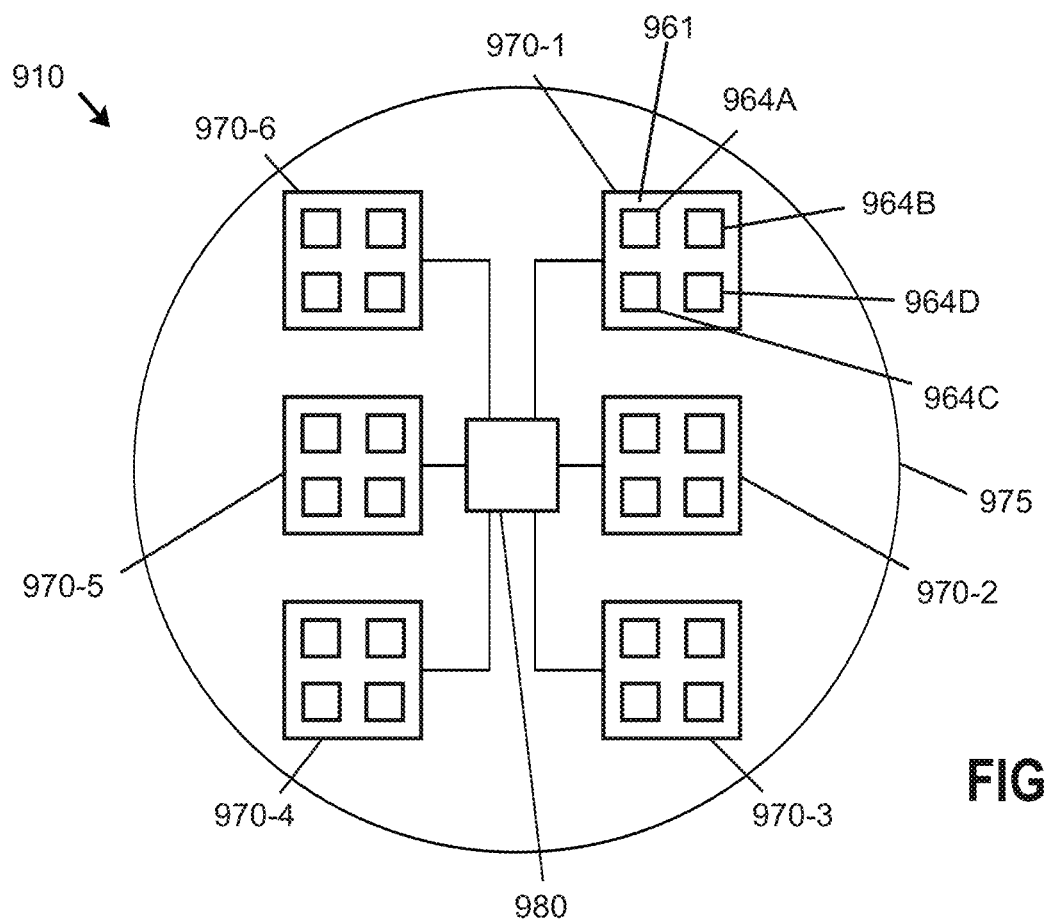
FIG._9
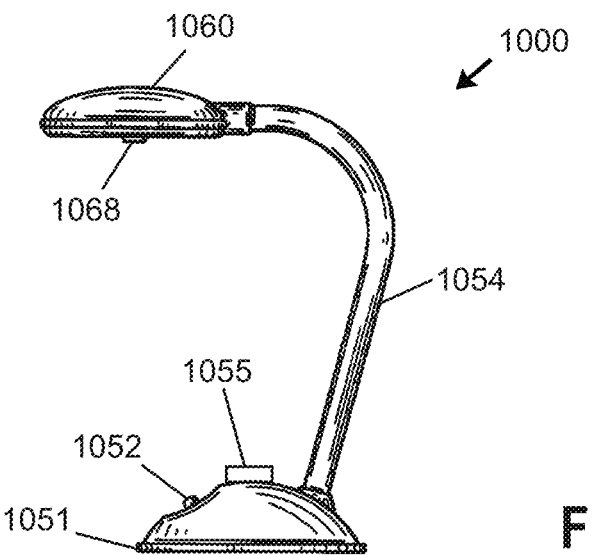
FIG._10

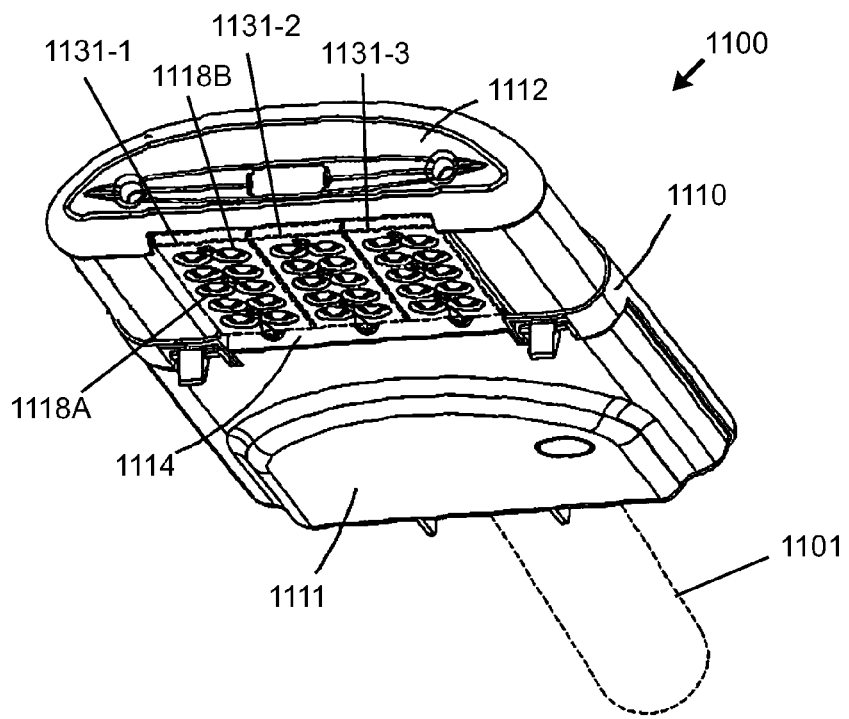
FIG._11A
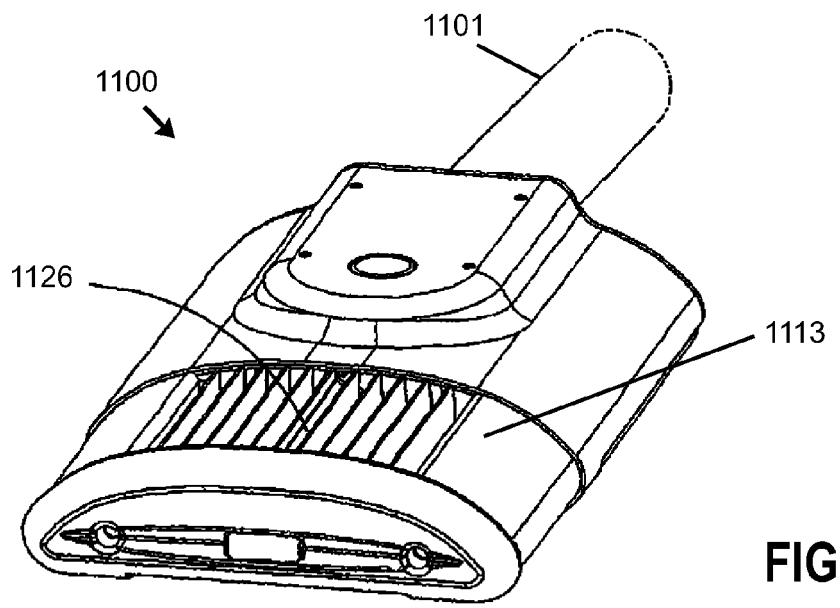
FIG._11B

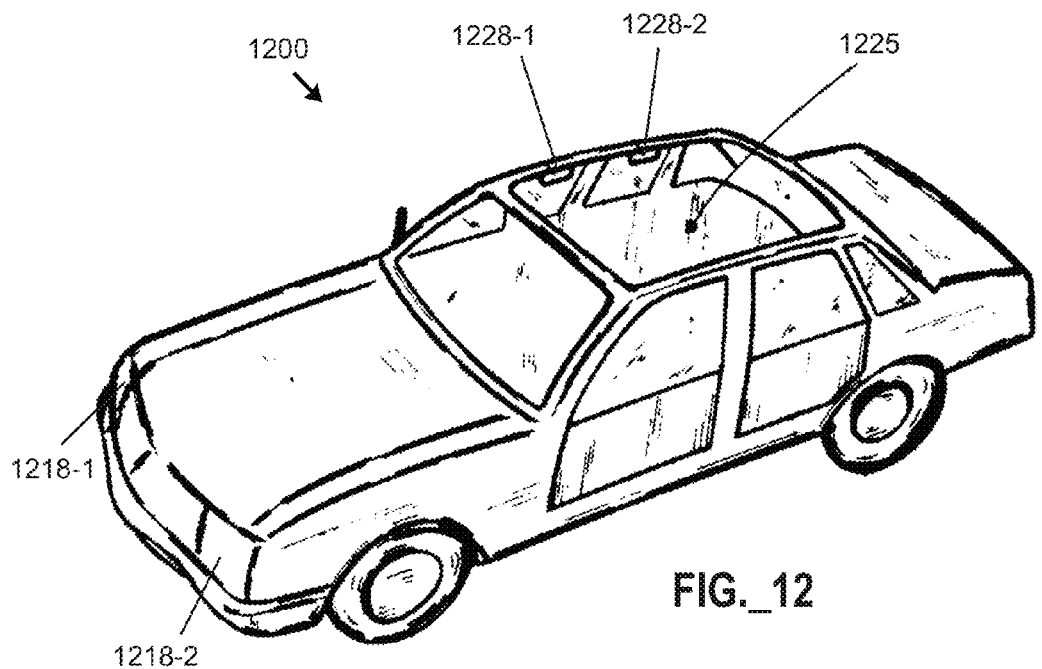
FIG._12
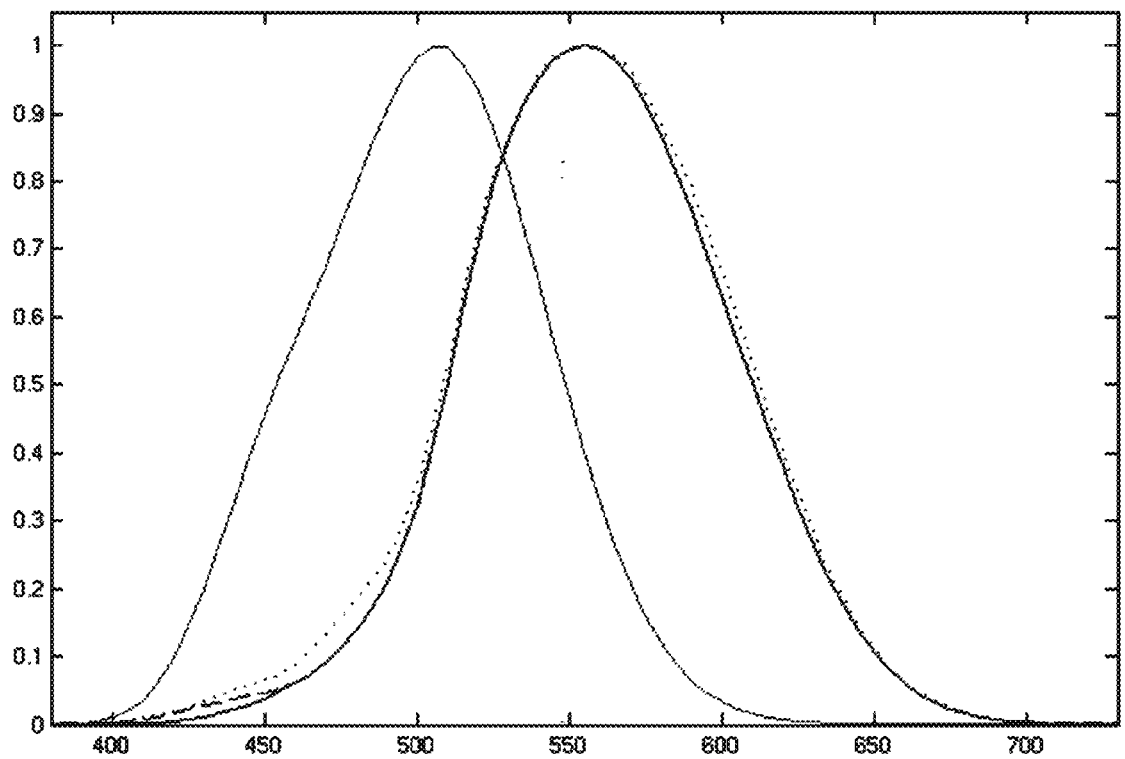
FIG._14
(RELATED ART)

SOLID STATE LIGHTING APPARATUS WITH HIGH SCOTOPIC/PHOTOPIC (S/P) RATIO

TECHNICAL FIELD

Subject matter herein relates to solid state lighting devices, including devices with multiple solid state light emitters arranged to generate aggregate emissions with high scotopic/photopic ratio and preferably having good color rendering characteristics, and relates to associated methods of fabricating such devices.

BACKGROUND

Solid state light sources may be used to provide colored (e.g., non-white) or white light (e.g., perceived as being white or near-white). A solid state lighting device may include, for example, at least one organic or inorganic light emitting diode ("LED") or a laser. White solid state emitters have been investigated as potential replacements for white incandescent or fluorescent lamps due to reasons including substantially increased efficiency and longevity. Longevity of solid state emitters is of particular benefit in environments where access is difficult and/or where change-out costs are extremely high. Solid state light sources provide potential for very high efficiency relative to conventional incandescent or fluorescent sources, but present challenges in simultaneously achieving good efficacy, good color reproduction, and color stability (e.g., with respect to variations in operating temperature).

Color reproduction is commonly measured using Color Rendering Index (CRI) or average Color Rendering Index (CRI Ra). CRI and CRI Ra provide relative measures of the shift in surface color and brightness of an object when lit by a particular lamp, wherein CRI utilizes fourteen indices (reference color) and CRI Ra is a modified average utilizing the first eight indices, all of which have low to moderate chromatic saturation. Daylight has a high CRI (Ra of approximately 100), with incandescent bulbs also being relatively close (Ra greater than 95), and fluorescent lighting being less accurate (typical Ra of 70-80) for general illumination use where the colors of objects are not important. For some general interior illumination, a CRI Ra>80 is acceptable. CRI Ra>85, and more preferably, CRI Ra>90, provides greater color quality.

The term "white light" or "whiteness" does not clearly cover the full range of colors along the BBL since it is apparent that a candle flame and other incandescent sources appear yellowish, i.e., not completely white. Accordingly, the color of illumination may be better defined in terms of correlated color temperature (CCT) and in terms of its proximity to the BBL. The pleasantness and quality of white illumination decreases rapidly if the chromaticity point of the illumination source deviates from the BBL by a distance of greater than 0.01 in the x, y chromaticity system. This corresponds to the distance of about four MacAdam ellipses, a standard employed by the lighting industry. A lighting device emitting light having color coordinates that are within four MacAdam step ellipses of the BBL and that has a CRI Ra>80 is generally acceptable as a white light for illumination purposes. A lighting device emitting light having color coordinates within seven or eight MacAdam ellipses of the BBL and that has a CRI Ra>70 is used as the minimum standards for many other white lighting devices including compact fluorescent and solid state lighting devices.

General illumination generally has a color temperature between 2,000 K and 10,000 K, with the majority of lighting devices for general illumination being between 2,700 K and 6,500 K. The white area proximate to (i.e., within approximately eight MacAdam ellipses of) of the BBL and between 2,500 K and 10,000 K, is shown in FIG. 13 (based on the 1931 CIE diagram).

Luminous efficacy is a measure of how well a light source produces visible light, and represents the ratio of luminous flux to power (with the power being either radiant flux or total power consumed by a source, depending on context). Wavelengths of light outside of the visible spectrum are not useful for illumination because they cannot be seen by the human eye. Moreover, the human eye exhibits greater response to some wavelengths of light than to others, even within the visible spectrum. Response of the human eye to light also varies with respect to the level of intensity of light.

At the back of the eye, the retina contains millions of light receptors that convert light into electrified signals that are sent to vision centers of the brain. The retina contains two major categories of photoreceptors called cones and rods because of their geometric shapes. The very central part of the retina, called the fovea, contains only cones. The rest of the retina is populated with both rods and cones, with the number of rods exceeding the number of cones by a ratio of about 10 to 1.

Photopic vision is the vision of the eye under well-lit conditions. In humans and many other animals, photopic vision is mediated by cone cells, and allows color perception and significantly higher visual acuity than available with scotopic vision. The human eye uses three types of cones (with biological pigments having maximum absorption values at wavelengths of about 420 nm (blue), 534 nm (bluish-green), and 564 nm (yellowish green)) to sense light in three bands of color, providing maximum efficacy of about 683 lm/W at a wavelength of 555 nm (green). Scotopic vision is the vision of the eye under low light conditions. In the human eye, cone cells are nonfunctional in low light; as a result, scotopic vision is produced exclusively through rod cells, which are most sensitive to wavelengths of light around 498 nm (green-blue) and are insensitive to wavelengths longer than about 640 nm (red). For young eyes, scotopic vision may peak around 507 nm, with a sensitivity equivalent to about 1700 lm/W. Scotopic vision results in poor color discrimination. Scotopic vision occurs at luminance levels of $10^{-2}$ to $10^{-6}$ $cd/m^2$; photopic vision occurs at luminance levels of 1 to $10^6$ $cd/m^2$ (normal light); and mesopic vision occurs in intermediate lighting conditions (luminance levels of $10^{-2}$ to 1 $cd/m^2$), with mesopic vision effectively being a combination of scotopic and photopic vision but yielding inaccurate visual acuity and color discrimination.

FIG. 14 illustrates scotopic and photopic luminosity functions, with the leftmost curve embodying a scotopic luminosity function (as adopted by the Commission Internationale de l'Éclairage (CIE) in 1951), and with the rightmost curve embodying photopic luminosity functions (wherein the solid line represents the CIE 1931 standard, the dashed curve represents the Judd-Vos 1978 modified data, and the dotted curve represents the Sharpe, Stockman, Jagla & Jägle 2005 data). The CIE 1931 photopic luminosity function also forms the central color matching function in the CIE 1931 color space. As shown in FIG. 1, the scotopic curve exhibits significant response above 420 nm, a peak at 507 nm, and very little response above 600 nm, whereas the photopic curve exhibits very limited response below 450 nm, a peak at 555 nm, and significant response above 650 nm before declining to zero response around 700 nm. For everyday light levels, the photopic luminosity function best approximates the response of the human eye; however, for low light levels, the response of the human eye changes and the scotopic luminosity function applies. This difference in the scotopic and photopic luminous efficacy of the source results from the shift of eye sensitivity function peaking at 555 nm (under photopic lighting conditions) to 507 nm (under scotopic lighting conditions), also known as the Purkinje shift.

Historically, lighting manufacturers have utilized light meters to determine lumen output of a lamp, with such light meters being calibrated by examining the eye's sensitivity to only cone activated vision in the very central part of the retina, the fovea, while ignoring the effect of rod activated vision. As a result, traditional lighting practice accepted a single sensitivity function based on the assumption that the more light sensitive rods only functioned at very dim light levels. More recent studies have demonstrated that rod photoreceptors are active not only in dim light but also at typical interior light levels as well.

Since rods are more sensitive than cones to bluish-white light sources characteristic of higher correlated color temperature (CCT) values, light sources with higher S/P ratios may potentially provide equivalent levels of perceived brightness and visual acuity at lower output power level. This explains why environments lit by warm white (3000K) and even cool white (4100K) lamps (e.g., fluorescent lights) appear less bright than the same environment lit by lamps of higher color temperatures, such as 5000K or above. Light with high S/P ratios, which provides higher correlated color temperature (CCT), yields relatively smaller pupils at a given photopic light level, so that object light rays are collected more at the central region of the eye, which may result in improved optical vision. Since an environment may be illuminated with lamps having higher S/P ratios at lower power levels to provide perceived brightness levels equivalent to those attainable with lamps having lower S/P ratios at higher power levels, use of lamps having higher S/P ratios may provide basis for saving energy.

Despite the potential for saving energy using lamps with higher S/P ratios, it is not straightforward to make high S/P ratio light sources with sufficient levels of color rendering (i.e., to enable color differentiation). There exists a trade-off between S/P ratio and color rendering index (CRI). This trend makes it challenging to provide a lamp capable of high S/P ratio and high CRI. Yet another challenge exists in making high S/P ratio sources with acceptably high color rendering in combination with sufficient brightness and high luminous efficacy—particularly since long-wavelength blue and green solid state light emitters (with peak wavelengths proximate to the scotopic response peak) have reduced luminous efficacy (e.g., relative to short wavelength blue solid state light emitters).

In terms of S/P ratio and CRI, the performance of current lighting technologies is typically limited. For example, incandescent light bulbs have a poor (low) S/P ratio of 1.41 despite a perfect CRI of 100. Among solid state light sources, traditional LED light sources including blue LEDs arranged to stimulate emissions of (yellow) yttrium aluminum garnet phosphors exhibit S/P ratios typically ranging from approximately 1.68 to approximately 2.38, but such emissions provide low CRI. Integration of different phosphors might improve CRI, but such phosphors may also decrease luminous efficacy. A solid state lighting device including a blue LED combined with semiconductor nanocrystal quantum dots arranged to output cyan, green, yellow, and red emissions to provide higher S/P ratio values (e.g., exceeding 2.50) is disclosed by Nizamoglu, S., et al., "High scotopic/photopic ratio white light-emitting diodes integrated with semiconductor nanophosphors of colloidal quantum dots," Optics Letters (May 15, 2011) Vol. 36, No. 10, pp. 1893-1895.

The art continues to seek improved lighting devices that address one or more limitations inherent to conventional devices.

SUMMARY

The present invention relates in various aspects to solid state (e.g., LED) lighting devices arranged to generate aggregate emissions with high scotopic/photopic ratio and preferably having good color rendering characteristics, high luminous efficacy, and high brightness.

In one aspect, the invention relates to a light emitting apparatus comprising: at least one first electrically activated solid state light emitter comprising a peak wavelength in a range of from 430 nm to 455 nm; at least one second electrically activated solid state light emitter comprising a peak wavelength in a range of from 456 nm to 469 nm; a first lumiphoric material comprising a peak wavelength in a range of from 600 nm to 650 nm and arranged to receive spectral output from the at least one first electrically activated solid state light emitter and the at least one second electrically activated solid state light emitter; and a second lumiphoric material comprising a peak wavelength in a range of from 500 nm to 555 nm and arranged to receive spectral output from the at least one first electrically activated solid state light emitter and the at least one second electrically activated solid state light emitter; wherein the light emitting apparatus is arranged to generate a spectral output including a ratio of scotopic to photopic light (S/P ratio) of at least 1.95. In certain embodiments, the foregoing light emitting apparatus may comprise a luminous efficacy of at least 110 lumens per watt and/or a CRI Ra value of at least 85. In certain embodiments, the foregoing light emitting apparatus may be devoid of any electrically activated solid state light emitter comprising a peak wavelength in a range of from 470 nm to 599 nm.

In another aspect, the invention relates to a light emitting apparatus comprising: at least one first electrically activated solid state light emitter comprising a peak wavelength in a range of from 430 nm to 479 nm; at least one second electrically activated solid state light emitter comprising a peak wavelength in a range of from 600 nm to 650 nm; and a first lumiphoric material comprising a peak wavelength in a range of from 500 nm to 555 nm and arranged to receive spectral output from the at least one first electrically activated solid state light emitter; wherein the at least one first electrically activated solid state light emitter is independently controllable relative to the at least one second electrically activated solid state light emitter; and wherein the light emitting apparatus is arranged to generate a spectral output including a ratio of scotopic to photopic light (S/P ratio) of at least 1.95.

In another aspect, the invention relates to a light emitting apparatus comprising: at least one first electrically activated solid state light emitter comprising a peak wavelength in a range of from 430 nm to 455 nm; at least one second electrically activated solid state light emitter comprising a peak wavelength in a range of from 456 nm to 469 nm; at least one third electrically activated solid state light emitter comprising a peak wavelength in a range of from 600 nm to 650 nm; and a first lumiphoric material comprising a peak wavelength in a range of from 500 nm to 555 nm and arranged to receive spectral output from the at least one first electrically activated solid state light emitter and the at least one second electrically activated solid state light emitter; wherein the light emitting apparatus is arranged to generate a spectral output including a ratio of scotopic to photopic light (S/P ratio) of at least 1.95. In certain embodiments, the foregoing light emitting apparatus may comprise a luminous efficacy of at least 110 lumens per watt and/or a CRI Ra value of at least 85. In certain embodiments, the light emitting apparatus may be devoid of any electrically activated solid state light emitter comprising a peak wavelength in a range of from 470 nm to 599 nm.

In another aspect, the invention relates to a method comprising illuminating an object, a space, or an environment, utilizing a light emitting apparatus as described herein.

In another aspect, the invention relates to a method for fabricating a light emitting apparatus, the method comprising: mounting multiple solid state emitters to a common substrate or submount, wherein the multiple solid state emitters include at least one first electrically activated solid state light emitter comprising a peak wavelength in a range of from 430 nm to 479 nm, and at least one second electrically activated solid state light emitter comprising a peak wavelength in a range of from 600 nm to 650 nm; applying a stencil or mask over the at least one second electrically activated solid state light emitter; applying a first lumiphoric material over the at least one first electrically activated solid state light emitter; and removing the stencil or mask, thereby yielding a light emitting apparatus that includes the first lumiphoric material overlying the at least one first electrically activated solid state light emitter, but is devoid of first lumiphoric material over the at least one second electrically activated solid state light emitter.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein Other aspects, features and embodiments of the invention will be more fully apparent from the ensuing disclosure and appended claims.

BRIEF DESCRIPTION OF THE DRAWINGS

FIG. 1A is a first perspective view of a solid state light emitter package that may embody multiple electrically activated solid state light emitters as described herein according to one embodiment, the emitter package including multiple LEDs arranged over an upper surface of a common substrate with multiple anodes and cathodes along a lower surface of the substrate.

FIG. 1B is a top plan view of a first subassembly of the emitter package of FIG. 1A, lacking a lens.

FIG. 1E is a bottom plan view of each of the emitter package of FIG. 1A and the subassemblies of FIGS. 1B, 1C, and 1D.

FIG. 1F is a right side elevation view of the first subassembly of FIG. 1B.

FIG. 1G is a side cross-sectional view of the third subassembly of FIG. 1D, taken along section lines "A"-"A" depicted in FIG. 1E.

FIG. 1H is an exploded right side elevation view of the emitter package of FIG. 1A, separately depicting the lens registered with the first subassembly of FIG. 1B.

FIG. 1I is a second perspective view of the emitter package of FIG. 1A.

FIG. 2A is a simplified schematic top plan view of a light emitting apparatus including a short wavelength blue electrically activated solid state light emitter and long wavelength blue electrically activated solid state light emitter each conformally coated with at least one lumiphor.

FIG. 2B is a simplified schematic top plan view of a light emitting apparatus including a short wavelength blue electrically activated solid state light emitter, a long wavelength blue electrically activated solid state light emitter, and a lumiphor region including at least one lumiphor spanning over each solid state light emitter.

FIG. 2C is a simplified schematic top plan view of a light emitting apparatus including multiple short wavelength blue electrically activated solid state light emitters, multiple long wavelength blue electrically activated solid state light emitters, and a lumiphor region including at least one lumiphor spanning over the solid state light emitters.

FIG. 3A is a simplified schematic top plan view of a light emitting apparatus including at least one lumiphor overlying a blue electrically activated solid state light emitter, and including a supplemental electrically activated solid state light emitter not overlaid with a lumiphor.

FIG. 3B is a simplified schematic top plan view of a light emitting apparatus including a short wavelength blue electrically activated solid state light emitter and a long wavelength blue electrically activated solid state light emitter each conformally coated with at least one lumiphor, and including a supplemental electrically activated solid state light emitter not overlaid with a lumiphor.

FIG. 3C is a simplified schematic top plan view of a light emitting apparatus including multiple short wavelength blue electrically activated solid state light emitters, a long wavelength blue electrically activated solid state light emitter overlaid with at least one lumiphor, a lumiphor region spanning each of the foregoing blue solid state emitters, and a supplemental electrically activated solid state light emitter not overlaid with a lumiphor.

FIG. 3D is a simplified schematic top plan view of a light emitting apparatus including multiple short wavelength blue electrically activated solid state light emitters, multiple long wavelength blue electrically activated solid state light emitters interspersed with the short wavelength blue emitters, multiple lumiphor regions spanning the blue solid state emitters, and multiple supplemental electrically activated solid state light emitters not overlaid with a lumiphor.

FIG. 4 is a side cross-sectional view of a leadframe-based solid state light emitter package including first and second electrically activated solid state light emitters overlaid with sequentially arranged first and second lumiphor regions or layers.

FIG. 5A is a simplified side-cross-sectional view of a light emitting apparatus including first and second electrically activated solid state light emitters overlaid with a lumiphor region that is remote (i.e., spatially segregated from) the solid state light emitters.

FIG. 5B is a simplified side-cross-sectional view of a light emitting apparatus including first and second electrically activated solid state light emitters overlaid with sequential first and second lumiphor regions that are remote (i.e., spatially segregated from) the solid state light emitters, with a dichroic filter arranged between the first and second lumiphor regions.

FIG. 6A is a perspective phantom view of a light emitting apparatus including a first multi-dimensional array of electrically activated solid state light emitters arranged under a partially symmetric lens.

FIG. 6B is a perspective phantom view of an alternative light emitting apparatus including a second multi-dimensional array of electrically activated solid state light emitters arranged under a partially symmetric lens, similar to the apparatus of FIG. 6A but including a larger number of emitters.

FIG. 6C is a top plan view of the light emitting apparatus of FIG. 6A.

FIG. 6D is a front elevation view of the light emitting apparatus of FIG. 6A.

FIG. 6E is a right side elevation view of the light emitting apparatus of FIG. 6A.

FIG. 6F is a top plan view of a submount of the light emitting apparatus of FIG. 6A.

FIG. 6G is a front elevation view of the submount of FIG. 6F.

FIG. 6H is a bottom plan view of the submount of FIG. 6F.

FIGS. 7A-7D embody charts of luminous flux variability, luminous efficacy variability, S/P ratio variability, and CRI variability, respectively, obtained by testing light emitting apparatuses according to FIG. 6A with six different combinations of LEDs and lumiphors.

FIG. 7E is a plot of chromaticity obtained by testing a subset of the light emitting apparatuses.

FIG. 7F represents positions of long wavelength blue (LWB) LEDs and short wavelength blue (SWB) LEDs for light emitting apparatuses including two LWB LEDs and six SWB LEDs of the apparatuses according to Configurations 2, 3, and 6 tested in connection with FIGS. 7A-7D.

FIG. 7G represents positions of long wavelength blue (LWB) LEDs and short wavelength blue (SWB) LEDs for light emitting apparatuses including four LWB LEDs and four SWB LEDs of the apparatuses according to Configurations 4 and 5 tested in connection with FIGS. 7A-7D.

FIG. 8A is a photograph depicting a solid state light emitting apparatus including a solid state light emitter package that includes multiple blue LEDs overlaid with lumiphoric material and multiple red LEDs not overlaid with lumiphoric material all arranged under a unitary lens, with the solid state emitter package arranged on a star-shaped substrate receiving two pairs of wires (conductors) permitting the red LEDs to be controlled independently of the blue LEDs.

FIG. 8B is a simplified schematic view of a solid state light emitter package similar to the package depicted in FIG. 8A.

FIG. 8C is a table summarizing results of testing three solid state light emitting apparatuses each according to the apparatus of FIG. 8A.

FIG. 8D is a chart depicting superimposed spectral outputs of (A) simulation of a 452 nm peak wavelength blue LED, (B) simulation of LuAG phosphor, (D) simulation of red LED, and (D) integrating sphere testing results for the first light emitting apparatus (lamp no. 1) referenced in FIG. 8C and corresponding to the design of FIG. 8A.

FIG. 8E is a table summarizing results of testing a light emitting apparatus according to FIG. 8A at two different temperatures (25° C. and at 85° C.).

FIG. 8F is a chart depicting superimposed spectral outputs of the light emitting apparatus of FIG. 8E at two different temperatures (25° C. and at 85° C.).

FIG. 9 is a simplified plan view of a light emitting apparatus including multiple electrically activated solid state light emitters as described herein and at least one control circuit.

FIG. 10 is a side elevation view of a desk lamp or table lamp embodying a light emitting apparatus including multiple electrically activated solid state light emitters as described herein.

FIG. 11A is a lower perspective view of an outdoor floodlight (e.g., street or roadway lamp) embodying a light emitting apparatus including multiple electrically activated solid state light emitters as described herein.

FIG. 11B is an upper perspective view of the outdoor floodlight of FIG. 11A

FIG. 12 is a simplified perspective view of a motor vehicle (i.e., automobile) including interior and exterior lights that each embody a light emitting apparatus including multiple electrically activated solid state light emitters as described herein.

FIG. 14 illustrates scotopic and photopic luminosity functions, with the leftmost curve embodying a scotopic luminosity function (as adopted by the Commission Internationale de l'Éclairage (CIE) in 1951), and with the rightmost curve embodying photopic luminosity functions (wherein the solid line represents the CIE 1931 standard, the dashed curve represents the Judd-Vos 1978 modified data, and the dotted curve represents the Sharpe, Stockman, Jagla & Jägle 2005 data).

DETAILED DESCRIPTION

Figure 1C:
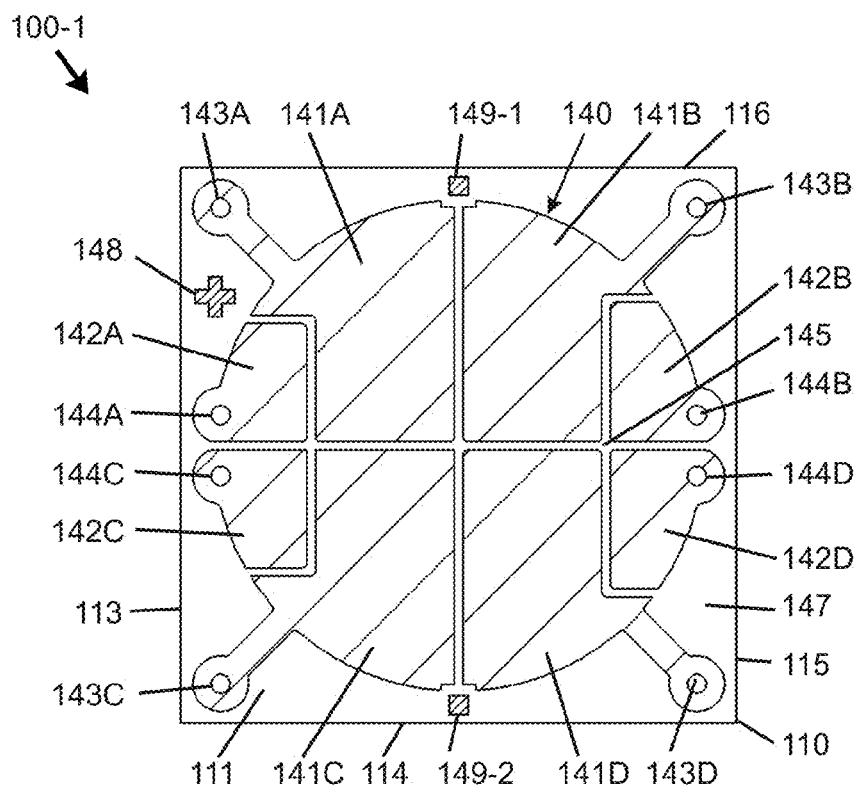
FIG. 1C is a top plan view of a second subassembly of the emitter package of FIG. 1A, lacking a lens, soldermask material, and LEDs.

As noted previously, the art continues to seek improved lighting devices that address one or more limitations inherent to conventional devices. For example, it would be desirable to provide lighting devices capable of providing high S/P ratio and high CRI, and to provide suitably high brightness, high luminous efficacy, and enhanced energy efficiency. It would also be desirable to provide lighting devices with reduced size, enhanced configuration flexibility, and/or extended duration of service.

The present invention relates in various aspects to solid state (e.g., LED) lighting devices including multiple electrically activated solid state emitters and at least one lumiphor (e.g., phosphor). Conventional wisdom in providing solid state lighting devices for providing high brightness and high luminous efficacy often employ yellow phosphors arranged to be stimulated by a relatively short wavelength blue LED (e.g., with peak wavelengths between 430-450 nm). Such devices typically exhibit relatively low S/P ratios, due to presence of a trough in the spectral output between the blue and yellow peaks. Applicants have found that by utilizing blue electrically activated solid state light emitters (optionally including short wavelength and long wavelength blue solid state emitters in combination) to stimulate green lumiphors (e.g., with peak wavelengths of from 500 nm to 555 nm), with supplemental emissions by either red lumiphors and/or red solid state light emitters (e.g., with peak wavelengths of from 600 nm to 650 nm), the resulting emissions may provide aggregate emissions with high S/P ratio (e.g., at least 1.95) and favorably high color rendering values, preferably in combination with high brightness and high luminous efficacy. In certain embodiments, light emitting apparatuses are devoid of lumiphors having peak emission in the yellow range.

In certain embodiments, at least one short wavelength blue (e.g., peak wavelength of from 430 nm to 455 nm) in combination with at least one long wavelength blue (e.g., peak wavelength of from 456 nm to 479 nm, or from 456 nm to 469 nm) solid state light emitter may be used to stimulate emissions of at least one green lumiphor (e.g., peak wavelength of from 500 nm to 555 nm, or from 530 nm to 540 nm) and at least one red lumiphor (e.g., peak wavelength of from 600 nm to 650 nm, or from 620 nm to 630 nm), wherein aggregate emissions include a S/P ratio of at least 1.95, more preferably at least 2.0, still more preferably at least about 2.05.

Multiple SWB solid state emitters, multiple LWB solid state emitters, multiple lumiphors, and/or multiple red solid state emitters may be provided. In certain embodiments, the number of LWB solid state emitters exceeds the number of SWB solid state emitters, with a SWB:LWB solid state emitter ratio of in a range of from 1.2:1 to 2.5:1, or in a range of from 1.5:1 to 2.0:1. In certain embodiments, the number of LWB solid state emitters and the number of SWB solid state emitters may be equal or substantially equal.

In certain embodiments, at least one blue (e.g., peak wavelength of from 430 nm to 479 nm, or from 430 nm to 469 nm, optionally including short wavelength and long wavelength blue emitters in combination) solid state light emitter may be used to stimulate emissions of at least one green lumiphor (e.g., peak wavelength of from 500 nm to 555 nm, or from 530 nm to 540 nm), and emissions of the at least one blue solid state light emitter and at least one green lumiphor may be supplemented with at least one red solid state light emitter (e.g. peak wavelength of from 600 nm to 650 nm, or from 620 nm to 630 nm) that is independently controllable relative to the at least one blue solid state light emitter, wherein aggregate emissions include a S/P ratio of at least 1.95. Multiple blue solid state emitters, multiple lumiphors, and/or multiple red solid state emitters may be provided.

In certain embodiments, at least one short wavelength blue (e.g., peak wavelength of from 430 nm to 455 nm) in combination with at least one long wavelength blue (e.g., peak wavelength of from 456 nm to 469 nm) solid state light emitter may be used to stimulate emissions of at least one green lumiphor (e.g., peak wavelength of from 500 nm to 555 nm, or from 530 nm to 540 nm), and emissions of the blue solid state light emitters and at least one green lumiphor may be supplemented with at least one red solid state light emitter (e.g. peak wavelength of from 600 nm to 650 nm, or from 620 nm to 630 nm), wherein aggregate emissions include a S/P ratio of at least 1.95. Multiple SWB solid state emitters, multiple LWB solid state emitters, multiple lumiphors, and/or multiple red solid state emitters may be provided.

Unless otherwise defined, terms used herein should be construed to have the same meaning as commonly understood by one of ordinary skill in the art to which this invention belongs. It will be further understood that terms used herein should be interpreted as having a meaning that is consistent with their meaning in the context of this specification and the relevant art, and should not be interpreted in an idealized or overly formal sense unless expressly so defined herein.

Embodiments of the invention are described herein with reference to cross-sectional, perspective, elevation, and/or plan view illustrations that are schematic illustrations of idealized embodiments of the invention. Variations from the shapes of the illustrations as a result, for example, of manufacturing techniques and/or tolerances, are to be expected, such that embodiments of the invention should not be construed as limited to particular shapes illustrated herein. This invention may be embodied in different forms and should not be construed as limited to the specific embodiments set forth herein. In the drawings, the size and relative sizes of layers and regions may be exaggerated for clarity.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions.

The expression "peak wavelength", as used herein, means (1) in the case of a solid state light emitter, the peak wavelength of light that the solid state light emitter emits if it is illuminated, and (2) in the case of a lumiphoric material, the peak wavelength of light that the lumiphoric material emits if it is excited.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the invention may include III-V nitride (e.g., gallium nitride) based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). Examples of vertical and horizontal LED chip structures are disclosed, for example, in U.S. Patent Application Publication No. 2008/0258130 to Bergmann et al. and in U.S. Patent Application Publication No. 2006/0186418 to Edmond et al., which are hereby incorporated by reference herein. Any combination of one or more of the following LED configurations may be used in a single solid state light emitting device: horizontal LED chips, horizontal flip LED chips, vertical LED chips, vertical flip LED chips, and/or combinations thereof, with conventional or reverse polarity. In certain embodiments, wirebonds may be used to facilitate electrical connection to LED chips (whether as anode only, cathode only, or anode and cathode), but in other embodiments, wirebonds may be omitted (e.g., in cases involving use of LEDs having electrical contacts mounted solely on the bottom side thereof and soldered to conductive regions (e.g., traces) arranged on a top surface of a substrate or submount).

Solid state light emitters may be used individually or in groups to emit one or more beams to stimulate emissions of one or more lumiphoric materials (e.g., phosphors, scintillators, lumiphoric inks, quantum dots, day glow tapes, etc.) to generate light at one or more peak wavelengths, or of at least one desired perceived color (including combinations of colors that may be perceived as white). Inclusion of lumiphoric (also called 'luminescent') materials in lighting devices as described herein may be accomplished by direct coating on lumiphor support elements or lumiphor support surfaces (e.g., by powder coating, inkjet printing, or the like), adding such materials to lenses, and/or by embedding or dispersing such materials within lumiphor support elements, such as (but not limited to) glass layers or discs, polymeric material layers, optical elements, or layers of similarly translucent or transparent materials capable of being coated with lumiphoric material or including lumiphoric material embedded therein.

In certain embodiments, lumiphoric materials may be spatially segregated (i.e., remotely located) from one or more electrically activated solid state emitters (e.g., LEDs). In certain embodiments, such spatial segregation may involve separation of a distance of at least about 1 mm, at least about 2 mm, at least about 5 mm, or at least about 10 mm Examples of lumiphoric materials are disclosed, for example, in U.S. Pat. No. 6,600,175 and U.S. Patent Application Publication No. 2009/0184616. Other materials, such as light scattering elements (e.g., particles) and/or index matching materials, may be associated with a lumiphoric material-containing element or surface. LED devices and methods as disclosed herein may include multiple LEDs of different colors, one or more of which may be white emitting (e.g., including at least one LED with one or more lumiphoric materials). One or more luminescent materials useable in devices as described herein may be down-converting or up-converting, or can include a combination of both types.

Various electrically activated solid state emitters (e.g., LEDs) disclosed herein are arranged to stimulate emissions of one or more lumiphoric materials. When one or more lumiphoric materials are arranged to be stimulated by at least one LED, emissions of at least one LED may be only partially absorbed by the one or more lumiphoric materials (wherein emissions output of a lighting apparatus includes an unabsorbed portion of emissions of the at least one LED in combination with emissions of the one or more lumiphoric materials) according to certain embodiments. In other embodiments, substantially all emissions of at least one LED may be absorbed by one or more lumiphoric materials. In certain embodiments, one or more solid state emitters may be used to stimulate emissions from a mixture of lumiphoric materials, or discrete layers of different lumiphoric material (e.g., including lumiphoric materials arranged to emit different colors or peak wavelengths).

In certain embodiments, control of one or more solid state emitter groups or sets may be responsive to a control signal (optionally including at least one sensor arranged to sense electrical, optical, and/or thermal properties and/or environmental conditions), a timer signal, and/or at least one user input. In certain embodiments, a photosensor may be used to affect operation ratio of a light emitting apparatus, such as by adjusting current of one or more different LEDs responsive to presence, absence, or level of ambient light; or responsive to presence or absence of motion (e.g., as indicative of presence or absence of a person, a vehicle, or another object). In certain embodiments, a control system may be configured to selectively provide one or more control signals to at least one current supply circuit. In various embodiments, current to different circuits or circuit portions may be pre-set, user-defined, or responsive to one or more inputs or other control parameters. When multiple LEDs are provided, such LEDs may be controlled as a group according to certain embodiments. In certain embodiments, LEDs of different colors or different peak wavelengths may be separately controlled, as may be useful to adjust color temperature and/or to maintain a desired color point as temperature increases, optionally in response to signals received from one or more temperature sensors. In certain embodiments, at least one control circuit arranged to control one or more LEDs may include a current supply circuit configured to independently apply an on-state drive current to each individual solid state emitter or group of solid state emitters, such as may be useful to adjust intensity, permit tuning of output color, permit tuning of color temperature, and/or affect dissipation of heat generated by solid state light emitters.

The term "substrate" as used herein in connection with lighting apparatuses refers to a mounting element on which, in which, or over which multiple solid state light emitters (e.g., emitter chips) may be arranged or supported (e.g., mounted). Exemplary substrates useful with lighting apparatuses as described herein include printed circuit boards (including but not limited to metal core printed circuit boards, flexible circuit boards, dielectric laminates, and the like) having electrical traces arranged on one or multiple surfaces thereof, support panels, and mounting elements of various materials and conformations arranged to receive, support, and/or conduct electrical power to solid state emitters. A unitary substrate may be used to support multiple solid state emitters or multiple groups of solid state emitters, and may further be used to support (and/or to be in electrical communication with) various circuit elements (e.g., control circuits, driver circuit elements, rectifier circuit elements, power supply elements, current limiting circuit elements, current diverting circuit elements, dimmer circuit elements, surge protection elements, electrostatic discharge elements, and the like), sensors, timers, and/or user input elements. In certain embodiments, a substrate may include multiple emitter mounting regions each arranged to receive one or more solid state light emitters and/or solid state emitter packages. Substrates or portions thereof may be conductive or insulating in character. In certain embodiments, at least a portion of a substrate may include a dielectric material to provide desired electrical isolation between electrical traces or other components. In certain embodiments, a substrate can comprise ceramic such as alumina, aluminum nitride, silicon carbide, or a polymeric material such as polyimide, polyester, etc. In certain embodiments, substrate can comprise a flexible circuit board or a circuit board with plastically deformable portions to allow the substrate to take a non-planar (e.g., bent) or curved shape allowing for directional light emission with LED chips or LED packages also being arranged in a non-coplanar manner relative to one another.

In certain embodiments, a substrate can be provided in a relatively small form factor in any desired shape (e.g., square, round, non-square, non-round, symmetrical and/or asymmetrical). Examples of small footprints or form factors of multi-emitter solid state light emitting apparatuses (e.g., including LED packages) as described herein may include less than 5 $cm^2$, less than 3 $cm^2$, less than 2 $cm^2$, less than 1 $cm^2$, less than 0.5 $cm^2$, less than 0.3 $cm^2$, or less than 0.25 $cm^2$. LED chips of any suitable size or form factor may be included in a multi-emitter lighting emitting apparatus, including chips having a width of up to about 2000 microns, up to about 1000 microns, up to about 500 microns, up to about 350 microns, or any other suitable size. In other embodiments, a substrate may comprise a larger form factor, such as may be suitable for replacement of light fixtures or elongated fluorescent tube-type bulbs.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without additional packaging. In certain embodiments, lighting devices components may use packaged LED chips in place of COB LED chips. For example, in certain embodiments, lighting devices may utilize series, parallel, or series/parallel arrangements of individual LEDs and/or LED packages, which may be configured according to various arrangements depending upon the application and/or voltage range desired. In certain embodiments, separately controllable solid stage emitters or groups of solid state emitters may be configured to operate at different voltages (such as, but are not limited to, 3V, 6V, and 12V).

In certain embodiments, one or more reflector elements (either symmetrical or asymmetrical in nature) may be attached to, integrally formed with, or otherwise associated with a substrate and arranged to reflect emissions from one or more (preferably multiple) LEDs, such as to direct emissions in one or more desired directions and/or generate one or more desired beam patterns. In certain embodiments, one or more optical elements may be arranged to receive emissions from one or more (preferably multiple) LEDs, and arranged to interact with such emissions to provide desired (e.g., light mixing, focusing, collimation, dispersion, and/or beam shaping) utility in either symmetrical or asymmetrical fashion. In certain embodiments, one or more optical elements may be provided in addition to one or more reflector elements.

In certain embodiments, emitters having similar output wavelengths may be selected from targeted wavelength bins. In certain embodiments, emitters having different output wavelengths may be selected from different wavelength bins, with peak wavelengths differing from one another by a desired threshold (e.g., at least 10 nm, at least 20 nm, at least 30 nm, at least 50 nm, or another desired threshold).

In certain embodiments, emissions of one or more blue solid state light emitters, at least one green lumiphor, and at least one red LED or red lumiphor, may be supplemented with one or more additional LEDs and/or additional lumiphors, such as cyan, green, yellow, amber, orange, red or any other desired colors.

Examples of green-emitting lumiphors (e.g., phosphors) that may be used in one or more embodiments include:

LuAG—Lu$_3$Al$_5$O$_{12}$:Ce
Ga-YAG—Y$_3$(Al$_{5-x}$Ga$_x$)O$_{12}$: Ce
Other doped or modified YAG:Ce
BOSE: Sr$_{2-x-y}$Ba$_x$Ca$_y$SiO$_4$:Eu
Sr$_6$P$_5$BO$_{20}$:Eu
MSi$_2$O$_2$N$_2$:Eu (M=one or a combination of Ba, Sr, Ca)
ZnS:Cu,Al
Ca3Sc2Si3O12
SrAl$_2$O$_4$:Eu
Sr$_4$Al$_{14}$O$_{25}$:Eu
Ca$_8$Mg(SiO$_4$)$_4$Cl$_2$:Eu,:Mn Utilization of a green lumiphor may involve balancing between S/P ratio and brightness, since short wavelength green lumiphor (e.g., peak wavelength of 505 nm) may provide a very high S/P ratio, but the resulting brightness may be low due to reduced efficiency and reduced lumen output of short wavelength green phosphors.

Examples of red-emitting lumiphors (e.g., phosphors) that may be used in one or more embodiments include:

(Ca$_{1-x}$Sr$_x$)SiAlN$_3$:Eu
BOSE: Sr$_{2-x-y}$Ba$_x$Ca$_y$SiO$_4$:Eu
Sr$_2$Si$_5$N$_8$:EU
M$_2$Si$_5$N$_8$:Eu (M=one or a combination of Ba, Sr, Ca)
CaSiN$_2$:Eu
Ca$_x$(Si,Al)$_{12}$(O,N)$_{16}$
SrTiO$_3$:Pr
Lu2O3:Eu
Sr$_{2-x}$Eu$_x$CeO$_4$
Sr$_2$Ce$_{1-x}$Eu$_x$O$_4$
(Sr$_{2-x}$La$_x$)(Ce$_{1-x}$Eu$_x$)O$_4$ In preferred embodiments, a red emitting phosphor should be highly potent (efficient), such that a relatively small number of phosphor particles and/or low phosphor weight may be needed to achieve a desired color point. Preferably, a red emitting phosphor should absorb blue photons efficiently with relatively low blue light scattering characteristics, in order to permit transmission of significant blue emissions in order to facilitate aggregated device emissions with increased S/P ratio. When red emitting phosphors are present in combination with green emitting phosphors, such red emitting phosphors should preferably be minimally absorptive of green photons in order to facilitate aggregated device emissions with increased S/P ratio.

In certain embodiments, yellow-emitting lumiphors (e.g., phosphors, such as may include peak wavelengths of from 550 nm to 580 nm, or from 550 nm to 565 nm) may be used to supplement emissions of one or more other lumiphors as described herein. Examples of yellow-emitting lumiphors (e.g., phosphors) that may be used in one or more embodiments include:

YAG—Y$_3$Al$_5$O$_{12}$:Ce
Ga-YAG—Y$_3$(Al$_{5-x}$Ga$_x$)O$_{12}$:Ce
Other doped or modified YAG:Ce
BOSE: Sr$_{2-x-y}$Ba$_x$Ca$_y$SiO$_4$:Eu Presence of a supplemental yellow lumiphor may be useful to increase brightness for a given S/P ratio.

Additional lumiphors are disclosed in U.S. Patent Application Publication Nos. 2011/0220929 A1 and 2011/0220920 A1, which are hereby both incorporated by reference herein.

In certain embodiments, light emitting apparatuses as disclosed herein may be used as described in U.S. Pat. No. 7,213,940, which is hereby incorporated by reference as if set forth fully herein. In certain embodiments, a combination of light (aggregated emissions) exiting a lighting emitting apparatus including multiple LED components as disclosed herein, may, in an absence of any additional light, produce a mixture of light having x, y color coordinates within an area on a 1931 CIE Chromaticity Diagram defined by points having coordinates (0.32, 0.40), (0.36, 0.48), (0.43, 0.45), (0.42, 0.42), (0.36, 0.38). In certain embodiments, combined emissions from a lighting emitting apparatus as disclosed herein may embody at least one of (a) a color rendering index (CRI Ra) value of at least 85, and (b) a color quality scale (CQS) value of at least 85.

Some embodiments of the present invention may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; with the disclosures of the foregoing patents and published patent applications being hereby incorporated by reference as if set forth fully herein.

In certain embodiments, a light emitting apparatus is arranged to provide aggregate emissions comprising a chromaticity within seven (more preferably within six, within five, within four, within three, within two, or within one) MacAdam ellipses of the BBL. In certain embodiments, a light emitting apparatus is arranged to provide aggregate emissions having a color temperature of from 2,700 K to 7,000 K, or from 3,500 K to 6,000 K, or from 3,900 K to 5,000 K.

In certain embodiments, a light emitting apparatus is arranged to provide emissions with a high S/P ratio, preferably a value of at least 1.95, at least 2.0, at least 2.1, at least 2.2, at least 2.3, or at least 2.4. In certain embodiments, a S/P value of a light emitting apparatus corresponds to operation at a temperature of 25° C., corresponds to operation at a temperature of 85° C., and/or corresponds to operation at temperatures ranging from 25° C. to 85° C.

The expressions "lighting device" and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. In certain embodiments, lighting devices or light emitting apparatuses as disclosed herein may be self-ballasted. In certain embodiments, a light emitting apparatus may be embodied in a light fixture.

The inventive subject matter further relates in certain embodiments to an illuminated enclosure (the volume of which can be illuminated uniformly or non-uniformly), comprising an enclosed space and at least one lighting device or light emitting apparatus as disclosed herein, wherein at least one lighting device or light emitting apparatus illuminates at least a portion of the enclosure (uniformly or non-uniformly). The inventive subject matter further relates to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, a LCD display, a cave, a tunnel, a yard, a lamppost, etc., having mounted therein or thereon at least one lighting device or light emitting apparatus as described herein. Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array). In certain embodiments, emitters of a first LED component may be interspersed with emitters of a separately controllable second LED component (e.g., with emitters of a first LED component arranged in a two-dimensional array that is superimposed with emitters of a second LED component arranged in a two dimensional array), such as may be beneficial to promote color mixing, optionally aided with one or more diffuser elements.

In certain embodiments, individual emitters within a multi-emitter LED component may be arranged in series, in parallel, or in a series-parallel relationship. In certain embodiments, multiple LED components of a solid state light emitting apparatus may be arranged in series, in parallel, or in series-parallel relationship. In certain embodiments, modulation of current and/or duty cycle may be performed with one or more current bypass and/or current shunt elements that may be optionally controlled by one or more control circuits. One or more control circuits may be optionally controlled responsive to one or more user input elements, one or more timer elements, and/or one or more sensor elements (e.g., temperature sensing element, photosensors, etc.). In certain embodiments, at least one photosensor may be used to sense ambient light level and/or color point, and one or more output signals of such sensor(s) may be used to affect operation of one or more lighting apparatuses described herein (e.g., to responsively adjust level (e.g., intensity)/dimming and/or color point of aggregate emissions of the lighting apparatus (es)). In certain embodiments, one or more control circuit elements and/or sensors may be supported by and/or in electrical communication with a substrate of a lighting apparatus.

In certain embodiments, a light emitting apparatus as disclosed herein (whether or not including one or more LED packages) may include at least one of the following items arranged to receive light from multiple LED components: a single lens; a single optical element; and a single reflector. In certain embodiments, a light emitting apparatus including multiple LEDs may include at least one of the following items: multiple lenses; multiple optical elements; and multiple reflectors. Examples of optical elements include, but are not limited to elements arranged to affect light mixing, focusing, collimation, dispersion, and/or beam shaping.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be arranged to stimulate one or more lumiphoric materials, which may be coated on, arranged over, or otherwise disposed in light receiving relationship to one or more solid state emitters. A lens and/or encapsulant materials, optionally including lumiphoric material, may be disposed over solid state emitters, lumiphoric materials, and/or lumiphor-containing layers in a solid state emitter package. Multiple solid state emitters may be provided in a single package.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles.

In certain embodiments, a light emitting apparatus may include or be embodied in one or more LED packages. One or more LED packages may include one or more of the following features: a single leadframe arranged to conduct electrical power to the multiple LEDs; a single reflector arranged to reflect at least a portion of light emanating from multiple LEDs; a single submount supporting multiple LEDs; and a single lens arranged to transmit at least a portion of light emanating from multiple LEDs.

In certain embodiments, a package includes a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate to which or over which multiple LED chips are mounted.

In certain embodiments, a light emitting apparatus may include at least one first short wavelength blue or SWB (e.g., peak wavelength of from 430 nm to 455 nm) electrically activated solid state light emitter in combination with at least one second long wavelength blue or LWB (e.g., peak wavelength of from 456 nm to 479 nm) electrically activated solid state light emitter to stimulate emissions of at least one green lumiphor (e.g., peak wavelength of from 500 nm to 555 nm), and may include at least one red lumiphor (e.g., peak wavelength of from 600 nm to 650 nm), wherein aggregate emissions of the apparatus include a S/P ratio of at least 1.95. In certain embodiments, the light emitting apparatus may be devoid of any electrically activated solid state light emitter comprising a peak wavelength in a range of from 470 nm to 599 nm. In certain embodiments, the first lumiphoric material and the second lumiphoric material may be provided in sequentially arranged first and second layers, respectively, wherein the first layer is arranged between the second layer and the solid state light emitters. In certain embodiments, the first lumiphoric material and the second material may be blended with one another and arranged over each of the first and second electrically activated solid state light emitters. In certain embodiments, the light emitting apparatus may include a third lumiphoric material comprising a peak wavelength in a range of from 550 nm to 580 nm and arranged to receive spectral output from the first and/or the second electrically activated solid state light emitter(s). In certain embodiments, the at least one first SWB emitter comprises a peak wavelength in a range of from 437 nm to 453 nm, the at least one second LWB emitter comprises a peak wavelength of from 456 nm to 469 nm or from 460 nm to 469 nm, the at least one green lumiphor comprises a peak wavelength of from 530 nm to 540 nm, and/or the at least one red lumiphor comprises a peak wavelength of from 620 nm to 630 nm. In certain embodiments, the first and second lumiphoric materials may be spatially separated from (e.g., in non-contacting relationship relative to) the at least one first SWB and the at least one second LWB solid state emitters. In certain embodiments, the number of first SWB emitters exceeds the number of second LWB emitters. In certain embodiments, multiple SWB emitters and multiple LWB emitters may be arranged and dispersed in a multi-dimensional (e.g., two-dimensional or three-dimensional) array. In certain embodiments, a light emitting apparatus may include at least one of the following features (a) to (d): (a) a single leadframe including multiple conductive leads arranged to supply current to the first SWB and second LWB emitters, (b) a single substrate arranged to structurally support the first SWB and second LWB emitters, (c) a single reflector arranged to reflect light emissions of the first SWB and second LWB emitters, and (d) a single lens arranged to transmit emissions of the first SWB and second LWB emitters. In certain embodiments, a light emitting apparatus may include an integral leadframe, a common submount, and a molded package body, wherein the first SWB and second LWB emitters are mounted to the common submount, the common submount is arranged between the integral leadframe and the first SWB and second LWB emitters, and the integral leadframe is at least partially encased in the molded package body. In certain embodiments, at least one of a diffusing element and a scattering element are arranged to interact with light emitted by the at least one first SWB emitter, the at least one second LWB emitter, the first lumiphoric material, and the second lumiphoric material. In certain embodiments, a light emitting apparatus comprises a luminous efficacy of at least 110 lumens per watt and/or a color rendering index ($R_A$) value of at least 85.

In certain embodiments, a light emitting apparatus may include at least one blue (e.g., peak wavelength of from 430 nm to 479 nm) first solid state light emitter to stimulate emissions of at least one green first lumiphor (e.g., peak wavelength of from 500 nm to 555 nm), and may include at least one red second solid state light emitter (e.g. peak wavelength of from 600 nm to 650 nm) that is independently controllable relative to the at least one blue first solid state light emitter, wherein aggregate emissions of the apparatus include a S/P ratio of at least 1.95. In certain embodiments, emissions of the at least one third electrically activated solid state light emitter are arranged to exit the light emitting apparatus without transit through the first lumiphoric material. In certain embodiments, the at least one first solid state emitter comprises a peak wavelength in a range of from 430 nm to 469 nm, the at least one first lumiphor comprises a peak wavelength in a range of from 530 nm to 540 nm, and/or the at least one second solid state light emitter comprises a peak wavelength in a range of from 620 to 630 nm. In certain embodiments, the at least one blue solid state light emitter comprises at least one electrically activated solid state light emitter comprising a peak wavelength in a range of from 430 nm to 455 nm (or from 437 nm to 453 nm) and comprises at least one electrically activated solid state light emitter comprising a peak wavelength in a range of from 456 nm to 479 nm (or from 460 nm to 469 nm). In certain embodiments, the first lumiphoric material is spatially segregated from the at least one first electrically activated solid state light emitter. In certain embodiments, a light emitting apparatus includes a second lumiphoric material comprising a peak wavelength in a range of from 550 nm to 580 nm and arranged to receive spectral output from the at least one first electrically activated solid state light emitter. In certain embodiments, the at least one second solid state emitter comprises a peak wavelength in a range of from 550 nm to 580 nm and is arranged to receive spectral output from the at least one first electrically activated solid state light emitter. In certain embodiments, a light emitting apparatus may include at least one of the following features (a) to (d): (a) a single leadframe including multiple conductive leads arranged to supply current to the first and second solid state emitters, (b) a single substrate arranged to structurally support the first and second solid state emitters, (c) a single reflector arranged to reflect light emissions of the first and second solid state emitters, and (d) a single lens arranged to transmit emissions of the first and second solid state emitters. In certain embodiments, a light emitting apparatus may include an integral leadframe, a common submount, and a molded package body, wherein the first and second solid state emitters are mounted to the common submount, the common submount is arranged between (i) the integral leadframe and (ii) the first and second solid state emitters, and the integral leadframe is at least partially encased in the molded package body. In certain embodiments, at least one of a diffusing element and a scattering element are arranged to interact with light emitted by the first and second solid state emitters and the first lumiphoric material. In certain embodiments, the light emitting apparatus may be devoid of any electrically activated solid state light emitter comprising a peak wavelength in a range of from 480 nm to 599 nm. In certain embodiments, multiple first solid state emitters and multiple second solid state emitters may be arranged in a multi-dimensional (e.g., two-dimensional or three-dimensional) array. In certain embodiments, a light emitting apparatus comprises a luminous efficacy of at least 110 lumens per watt and/or a color rendering index ($R_A$) value of at least 85.

In certain embodiments, a light emitting apparatus may include at least one short wavelength blue or SWB (e.g., peak wavelength of from 430 nm to 455 nm) first electrically activated solid state emitter in combination with at least one long wavelength blue or LWB (e.g., peak wavelength of from 456 nm to 469 nm) second electrically activated solid state light emitter used to stimulate emissions of at least one green first lumiphor (e.g., peak wavelength of from 500 nm to 555 nm, or from 530 nm to 540 nm), and may include at least one red third electrically activated solid state light emitter (e.g. peak wavelength of from 600 nm to 650 nm, or from 620 nm to 630 nm), wherein aggregate emissions of the apparatus include a S/P ratio of at least 1.95. In certain embodiments, the light emitting apparatus is devoid of any electrically activated solid state light emitter comprising a peak wavelength in a range of from 470 nm to 599 nm. In certain embodiments, emissions of the at least one third electrically activated solid state light emitter are arranged to exit the light emitting apparatus without transit through the first lumiphoric material. In certain embodiments, the at least one third electrically activated solid state light emitter is independently controllable relative to the at least one first electrically activated solid state light emitter and the at least one second electrically activated solid state light emitter. In certain embodiments, the first lumiphoric material is spatially segregated from each of the at least one first SWB solid state light emitter and the at least one second LWB solid state light emitter. In certain embodiments, the at least one first SWB emitter comprises a peak wavelength in a range of from 437 nm to 453 nm, the at least one second LWB emitter comprises a peak wavelength of 460 nm to 469 nm, the at least one green first lumiphor comprises a peak wavelength of from 530 nm to 540 nm, and/or the at least one red solid state emitter comprises a peak wavelength of from 620 nm to 630 nm. In certain embodiments, the light emitting apparatus includes a second lumiphoric material comprising a peak wavelength in a range of from 550 nm to 580 nm and arranged to receive spectral output from the first SWB and/or the second LWB solid state light emitter(s). In certain embodiments, a light emitting apparatus may include at least one of the following features (a) to (d): (a) a single leadframe including multiple conductive leads arranged to supply current to the first through third solid state emitters, (b) a single substrate arranged to structurally support the first through third solid state emitters, (c) a single reflector arranged to reflect light emissions of the first through third state emitters, and (d) a single lens arranged to transmit emissions of the first through third solid state emitters. In certain embodiments, a light emitting apparatus may include an integral leadframe, a common submount, and a molded package body, wherein the first through third solid state emitters are mounted to the common submount, the common submount is arranged between (i) the integral leadframe and (ii) the first through third solid state emitters, and the integral leadframe is at least partially encased in the molded package body. In certain embodiments, at least one of a diffusing element and a scattering element are arranged to interact with light emitted by the first through third solid state emitters and the first lumiphoric material. In certain embodiments, multiple first, second, and third solid state emitters may be provided and arranged in a multi-dimensional (e.g., two-dimensional or three-dimensional) array. In certain embodiments, a light emitting apparatus comprises a luminous efficacy of at least 110 lumens per watt and/or a color rendering index ($R_A$) value of at least 85.

In certain embodiments, an object, a space, or an environment may be illuminated utilizing a light emitting apparatus as described herein.

In certain embodiments, an outdoor lamp (e.g., street lamp, security lamp, or the like) may embody a light emitting apparatus as described herein. In certain embodiments, an indoor light fixture or indoor lamp may embody a light emitting apparatus as described herein.

In certain embodiments, one or more vehicular exterior lamps (including but not limited to exterior lights such as headlamps of motorized or powered vehicles such as automobiles, buses, motorcycles, trains, airplanes, helicopters, etc.) may embody a light emitting apparatus as described herein.

In certain embodiments, one or more vehicular interior lamps (including but not limited to interior lights for motorized or powered vehicles such as automobiles, buses, motorcycles, trains, airplanes, helicopters, etc.) may embody a light emitting apparatus as described herein.

In certain embodiments, a method for fabricating a light emitting apparatus includes: mounting multiple solid state emitters to a common substrate or submount, wherein the multiple solid state emitters include at least one first electrically activated solid state light emitter comprising a peak wavelength in a range of from 430 nm to 479 nm, and at least one second electrically activated solid state light emitter comprising a peak wavelength in a range of from 600 nm to 650 nm; applying a stencil or mask over the at least one second electrically activated solid state light emitter; applying a first lumiphoric material over the at least one first electrically activated solid state light emitter; and removing the stencil or mask, thereby yielding a light emitting apparatus that includes the first lumiphoric material overlying the at least one first electrically activated solid state light emitter, but devoid of first lumiphoric material over the at least one second electrically activated solid state light emitter. In certain embodiments, the at least one first electrically activated solid state light emitter comprises at least one electrically activated solid state light emitter comprising a peak wavelength in a range of from 430 nm to 455 nm and may comprise at least one electrically activated solid state light emitter comprising a peak wavelength in a range of from 456 nm to 479 nm.

Various illustrative features are described below in connection with the accompanying figures.

FIG. 1A illustrates a solid state emitter package 100 that may include various combinations of electrically activated solid state light emitters (e.g., LEDs) and one or more lumiphors as described herein. The emitter package 100 includes multiple (e.g., four) LED chips 150A-150D that may be separately controlled and that are supported by an insulating substrate 110 (e.g., preferably, but not necessarily, comprising ceramic material) having an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the upper surface 111 of the substrate 110. Gaps 145 may be provided between adjacent die attach pads 141A-141D and/ or electrical elements 142A-142D to prevent undesired conductive electrical communication. In certain embodiments, die attach pads need not be electrically conductive, such as in cases where anode and cathode connections to a solid state emitter chip are both made with wirebonds. Optional elements that may be formed concurrently with the electrical traces 140 but not serve as part of any conductive path through the package 100 include a polarity or positional identifying mark 148 and chip singulation alignment marks 149-1, 149-2 (used during singulation, such as by sawing, of emitter packages or subassemblies thereof from a wafer or superassembly from which multiple emitter packages are formed). An insulating soldermask 147 (shown in greater detail in FIG. 1B) is patterned over peripheral portions of the electrical traces 140, and a molded lens 160 (e.g., including a raised or hemispherical portion 161 and a base portion 162) is arranged over the upper surface 111 of the substrate 110 and is arranged to transmit at least a portion of light generated by the LED chips 150A-150D.

LED chips 150A-150D of any suitable peak wavelength (e.g., color) may be used, and optionally arranged to stimulate emissions of one or more lumiphors (e.g., phosphors). Although the LED chips 150A-150D may be separately controlled, in certain embodiments groups of two or more LED chips 150A-150D or groups of LED chips may be controlled together in a groupwise fashion. Although four LED chips 150A-150D are illustrated in FIG. 1A, it is to be appreciated that a LED package may include any desirable number of LED chips, including groups of chips arranged in series, in parallel, or in series-parallel configurations.

FIG. 1B is a top plan view of a first subassembly 100-3 of the emitter package 100 illustrated in FIG. 1A, with the subassembly 100-3 lacking the lens 160 and representing the soldermask 147 with hatched lines for emphasis. As shown in FIG. 1B, the soldermask 147 is arranged over peripheral portions of the top side electrical traces 140 between the side walls 113-116 and a roughly circular window arranged below a raised portion 161 of the lens 160.

FIG. 1C is a top plan view of a second subassembly 100-1 of the emitter package 100 illustrated in FIG. 1A, with the subassembly 100-1 lacking a lens, soldermask, and LEDs, but with the traces 140 represented with hatched lines for emphasis. As shown in FIG. 1C, the electrical traces 140 extend peripherally outward beyond the roughly circular window defined in the soldermask 147 (illustrated in FIG. 1B), with optional alignment holes 143A-143D defined in peripheral portions of the die attach pads 141A-141D, and optional alignment holes 144A-144D defined in peripheral portions of the additional electrical elements 142A-142D. The various alignment holes 143A-143D, 144A-144D may be used during manufacture, for example, to promote alignment with electrically conductive vias (e.g., as shown in FIG. 1G) defined through the insulating substrate 110.

Figure 1D:
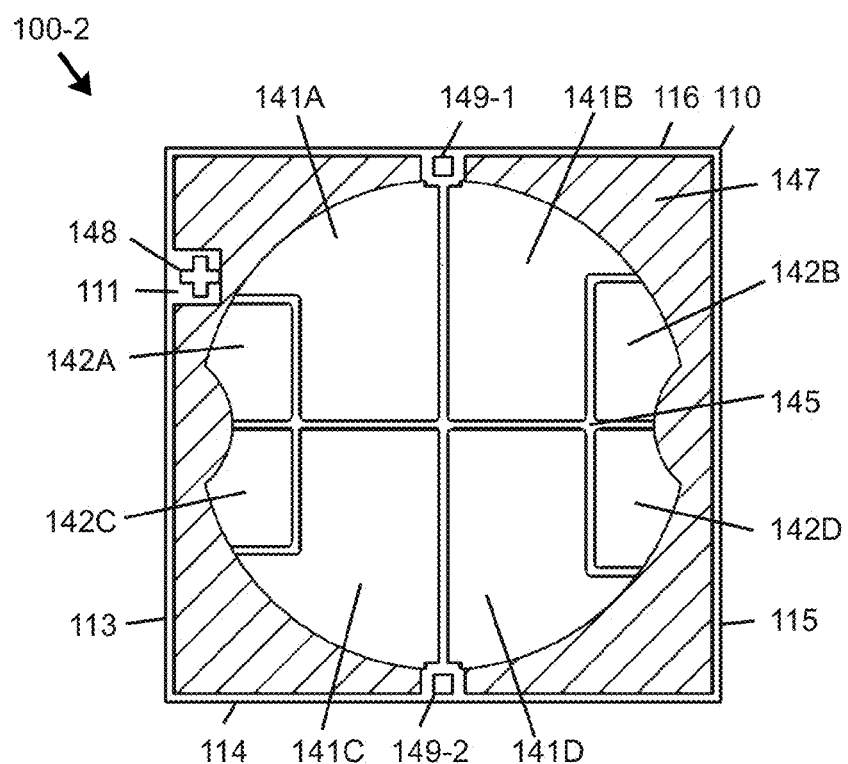
FIG. 1D is a top plan view of a third subassembly of the emitter package of FIG. 1A, lacking a lens and LEDs.

FIG. 1D is a top plan view of a third subassembly 100-2 of the emitter package 100 illustrated in FIG. 1A, with the subassembly 100-2 lacking a lens, and LEDs, but with the soldermask 147 represented with hatched lines for emphasis FIG. 1E is a bottom plan view of each of the emitter package 100 of FIG. 1A and the subassemblies of FIGS. 1B, 1C, and 1D. A lower surface 112 of the substrate 110 includes four anodes 121A-121D and four cathodes 122A-122D patterned thereon (e.g., as electrical traces), with one paired anode/cathode per quadrant. The separate anodes 121A-121D and cathodes 122A-122D enable separate control of the multiple LED chips 150A-150D if desired. Each anode 121A-121D may include an optional alignment hole 123A-123D and each cathode 122A-122D may include an optional alignment hole 124A-124D. The various anodes 121A-121D and cathodes 122A-122D are separated by gaps that may be filled with soldermask material sections 127-1, 127-2. A thermal element (e.g., thermal spreading element) 126 may be arranged along the lower surface 112 between the soldermask material sections 127-1, 127-2 and generally underlapping the LED chips 150A-150D. The thickness of the thermal element 126 may be the same as or different from (e.g., thicker than) the anodes 121A-121D and cathodes 122A-122D. As shown, the emitter package 100 is devoid of any anode or cathode arranged on, or extending laterally beyond, any side wall 113-116 of the emitter package 100.

FIG. 1F is a right side elevation view of the first subassembly 100-3 illustrated in FIG. 1B, being devoid of a lens but showing LED chips 150B, 150D and wirebonds 152 arranged over an upper surface 111 of the substrate 110.

FIG. 1G is a side cross-sectional view of the third subassembly 100-2 of FIG. 1D, taken along section lines "A"-"A" depicted in FIG. 1E. FIG. 1G illustrates electrically vias 125C, 125D defined through the substrate 110 between the upper and lower surfaces 111, 112, and arranged to provide electrical communication between top side traces (die attach pads) 141C, 14D and bottom side traces (anodes) 121C, 121D. The thermal element 126 is further illustrated along the lower surface 112 of the substrate 110. As shown in FIG. 1G, the upper soldermask 147 may extend laterally past the top side traces 140 but not quite to side edges 113, 115 of the substrate 110.

FIG. 1H is an exploded right side elevation view of the emitter package 100, separately depicting the lens 160 registered with the first subassembly 100-3 of FIG. 1B. FIG. 1I is another perspective view of the emitter package 100. Although FIGS. 1H-1I illustrate the lens 160 as including a hemispherical central raised portion 161, it is to be appreciated that any suitable lens shape (including raised, flat, or recessed shapes) may be provided in various embodiments. The lens 160 is preferably molded and may either be molded in place over the LED chips 150A-150D and substrate 110, or may be pre-molded and then affixed to a subassembly including the substrate 110 and LED chips 150A-150D.

FIG. 2A illustrates a light emitting apparatus 210 including a first short wavelength blue (SWB) solid state emitter (e.g., LED) 213 overlaid with a first lumiphoric material region 216-1 and a second long wavelength blue (LWB) solid state emitter (e.g., LED) 214 overlaid with a second lumiphoric material region 216-2, wherein each LED is supported in or on a substrate or other body structure 219. Each LED 213, 214 is arranged on a different die mounting region 211A, 211B. Each lumiphoric material region 216-1, 216-2 may include one lumiphor or (more preferably) multiple lumiphors. In certain embodiments, each lumiphoric material region 216-1, 216-2 may include a first lumiphoric material comprising a peak wavelength in a range of from 600 nm to 650 nm and a second lumiphoric material comprising a peak wavelength in a range of from 500 nm to 555 nm. As shown in FIG. 2A, the lumiphoric material regions 216-1, 216-2 are discontinuous relative to one another. In certain embodiments, lumiphoric material may be conformally coated on individual LEDs 213, 214. Although FIG. 2A illustrates two LEDs 213, 214, it is to be appreciated that any suitable number or more (e.g., one, two, three, four, five, six, etc.) LED chips may be associated with a light emitting apparatus or subassembly in certain embodiments. The apparatus 210 may embody any suitable components, features, and/or capabilities as described herein, and may be separately controllable. In certain embodiments, additional LEDs and/or lumiphors may be provided.

FIG. 2B illustrates a light emitting apparatus 220 similar to the lighting apparatus of FIG. 2A, but including a single lumiphoric material region 226 spanning over both the SWB LED 223 and the LWB LED 224. Each LED is arranged on a different die mounting region 221A, 221B and is supported by a substrate or other body structure 229. The lumiphoric material region 226 may include one lumiphor or (more preferably) multiple lumiphors. In certain embodiments, the lumiphoric material region 226 may include a first lumiphoric material comprising a peak wavelength in a range of from 600 nm to 650 nm and a second lumiphoric material comprising a peak wavelength in a range of from 500 nm to 555 nm. The apparatus 220 may embody any suitable components, features, and/or capabilities as described herein, and may be separately controllable. In certain embodiments, additional LEDs and/or lumiphors may be provided.

FIG. 2C illustrates a light emitting apparatus 240 similar to the lighting apparatus of FIG. 2B, but including multiple SWB LEDs 243A-243X and multiple LWB LEDs 244A-244X (wherein the term "X" represents a variable and is not limited to any specific quantity or number of LEDs) arranged in a two-dimensional array and overlaid with a lumiphoric material region 246 that may include one lumiphor or (more preferably) multiple lumiphors. Each LED 243A-243X, 244A-244X is arranged on a different die mounting region 241A-241X and supported by a single substrate or other body structure 249. In certain embodiments, the lumiphoric material region 246 may include a first lumiphoric material comprising a peak wavelength in a range of from 600 nm to 650 nm and a second lumiphoric material comprising a peak wavelength in a range of from 500 nm to 555 nm. The apparatus 240 may embody any suitable components, features, and/or capabilities as described herein, and different groups of LEDs 243A-243X and/or LEDs 244A-244X may be separately controllable. In certain embodiments, additional LEDs and/or lumiphors may be provided.

FIG. 3A illustrates a light emitting apparatus 300 including a blue electrically activated solid state light emitter (e.g. LED) 303 overlaid with a lumiphoric material region 306, wherein the blue LED 303 is accompanied with a red solid state light emitter (e.g., LED) 305. Each LED 303, 305 is arranged on a different die mounting region 301A, 301B and is supported by a substrate or other body structure 309. In certain embodiments, the lumiphoric material region 306 may include a first lumiphoric material comprising a peak wavelength in a range of from 600 nm to 650 nm. The apparatus 300 may embody any suitable components, features, and/or capabilities as described herein, and the different LEDs 303, 305 may be separately controllable. In certain embodiments, additional LEDs and/or lumiphors may be provided.

FIG. 3B illustrates a light emitting apparatus 310 similar to the lighting apparatus of FIG. 2A, but with the addition of a red solid state light emitter (e.g., LED) 315. The lighting apparatus 310 includes a first short wavelength blue (SWB) solid state emitter (e.g., LED) 313 overlaid with a first lumiphoric material region 316-1, a second long wavelength blue (LWB) solid state emitter (e.g., LED) 314 overlaid with a second lumiphoric material region 316-2, and a third red solid state light emitter (e.g., LED) 315, wherein each LED 313-315 is supported in or on a substrate or other body structure 319. Each LED 313-315 is arranged on a different die mounting region 311A-311C. Each lumiphoric material region 316-1, 316-2 may include one lumiphor or (more preferably) multiple lumiphors. In certain embodiments, each lumiphoric material region 316-1, 316-2 may include a first lumiphoric material comprising a peak wavelength in a range of from 600 nm to 650 nm and a second lumiphoric material comprising a peak wavelength in a range of from 500 nm to 555 nm. As shown in FIG. 3A, the lumiphoric material regions 216-1, 216-2 are discontinuous relative to one another. In certain embodiments, lumiphoric material may be conformally coated on individual blue LEDs 313, 314. The apparatus 310 may embody any suitable components, features, and/or capabilities as described herein, and may be separately controllable. In certain embodiments, the blue LEDs 313, 314 may be controlled as a group, and the red LED 315 may be controlled separately. In certain embodiments, additional LEDs and/or lumiphors may be provided.

FIG. 3C illustrates a light emitting apparatus 320 similar to the lighting apparatus of FIG. 3B, with addition of another SWB LED and a single lumiphoric material region 326 overlying each blue LED 323A, 323B, 324. The lighting apparatus 320 includes first and second short wavelength blue (SWB) solid state emitters (e.g., LEDs) 323A-323B, a long wavelength blue (LWB) solid state emitter (e.g., LED) 324, and a red solid state light emitter (e.g., LED) 325, wherein each LED 323A, 323B, 324, 325 is arranged on a different die mounting region 321A-321D and is supported in or on a substrate or other body structure 329. In certain embodiments, the lumiphoric material region 326 may include a first lumiphoric material comprising a peak wavelength in a range of from 600 nm to 650 nm and a second lumiphoric material comprising a peak wavelength in a range of from 500 nm to 555 nm. The apparatus 320 may embody any suitable components, features, and/or capabilities as described herein, and at least some of the LEDs 323A, 323B, 324, 325 may be separately controllable. In certain embodiments, the blue LEDs 322A, 323B, 324 may be controlled as a group, and the red LED 325 may be controlled separately. In certain embodiments, additional LEDs and/or lumiphors may be provided.

FIG. 3D illustrates a light emitting apparatus 330 including multiple SWB solid state emitters (e.g., LEDs) 333A-333X and multiple LWB solid state emitters (e.g., LEDs) 334A-334X arranged to stimulate emissions of at least one lumiphoric material arranged in multiple lumiphoric material regions 336-1 to 336-4, and including multiple red solid state emitters 335A-335X. Each LED 333A-333X, 334A-334X, 335A-335X is supported in or on a substrate or other body structure 339. The blue LEDs 333A-333X, 334A-334X are arranged in clusters 338-1 to 338-4, wherein each cluster 338-1 to 338-4 is separately overlaid with a corresponding lumiphoric material region 336-1 to 336-4. Each cluster 338-1 to 338-4 is arranged in a different quadrant of the substrate 339, with the red LEDs 335A-335X arranged in two orthogonally arranged crossing linear rows disposed between the clusters 338-1-338-4. As illustrated in FIG. 3D, each cluster 338-1 to 338-4 includes equal numbers of SWB and LWB LEDs, but in certain embodiments, more SWB LEDs may be provided relative to the number of LWB LEDs. In certain embodiments, the lumiphoric material regions 336-1 to 336-4 may include a lumiphoric material comprising a peak wavelength in a range of from 600 nm to 650 nm. The apparatus 330 may embody any suitable components, features, and/or capabilities as described herein, and at least some of the LEDs 333A-333X, 334A-334X, 335A-335X may be separately controllable. In certain embodiments, the blue LEDs 333A-333X, 334A-334X may be controlled as a group, and the red LEDs 335A-335X may be controlled separately. In certain embodiments, additional LEDs and/or lumiphors may be provided.

In certain embodiments, multiple LEDs and at least one lumiphor as described herein may be provided in a multi-chip solid state emitter package. Referring to FIG. 4, an exemplary emitter package 400 may include multiple electrically activated solid state light emitters 401A, 401B. Although only two solid state emitters 401A, 401B are depicted in the package 400 according to FIG. 4, it is to be appreciated that any desirable number of solid state emitter chips may be provided in a single package and/or group of solid state emitter packages. The emitters 401A, 401B may be vertical devices including anode and cathode contacts on opposing faces, respectively. The solid state emitters 401A, 401B may optionally be mounted in a flip-chip configuration, with light emitting upward through substrates of the emitters 401A, 401B. In certain embodiments, solid state emitter chips may be mounted with substrate portions thereof proximate to a submount 405 or other supporting structure. Wirebond connections 404A, 404B may connect external leads 406A, 406B with the emitter chips 401A, 401B and/or conductive traces on the submount 405. The electrical leads 406A, 406B may extend laterally outward past side edges of a body structure 450 containing the submount 405. The submount 405 and solid state emitters 401A, 401B may be arranged in a reflector cup 454 along an upper surface of (or optionally integrated with) the package body structure 450. The body structure 450 may comprise an electrically insulating material such as a molded polymeric composition and/or a ceramic material. Disposed within a central portion of the body 450 is a heatsink 407, which extends between the submount 405 and a lower surface of the body 450. The heatsink 407 may be integrally formed with, or joined to, a leadframe encompassing the externally accessible leads 406A, 406B.

As shown in FIG. 4, within the reflector cup 454, the solid state emitters 401A, 401B are overlaid with a first layer 410 including at least one first lumiphoric material, overlaid with a second layer 420 including at least one second lumiphoric material, and overlaid with an encapsulant and/or lens 440. The encapsulant and/or lens 440 may be hemispherical in shape with a rounded light emitting surface 448. In certain embodiments, the first layer 410 includes a red lumiphoric material including a peak wavelength in a range of from 600 nm to 650 nm, the second layer 420 includes a green lumiphoric material including a peak wavelength in a range of from 500 nm to 550 nm, the first solid state emitter 401A includes a short wavelength blue LED, and the second solid state emitter 401B includes a long wavelength blue LED. In certain embodiments, red and green lumiphoric material may be mixed in a single (e.g., first) layer 410, and the second layer 420 may be eliminated.

In operation of the package 400, electric current is applied between the leads 406A, 406B to energize the emitters 401A, 40B, with at least a portion of the resulting emissions of at least one of the emitters 401A, 401B used to stimulate lumiphoric materials contained in the first layer 410 and second layer 420. Aggregated emissions from the package 400 may include combined emissions from the first solid state emitter 401A, second solid state emitter 401B, lumiphoric material(s) contained in the first layer 410, and lumiphoric material(s) contained in the second layer 420. An upper surface 448 of the encapsulant and/or lens 440 may constitute a light emitting surface of the device 400, or may be overlaid by one or more additional layers or structures (not shown). A similar solid state emitter package and fabrication details regarding same are provided in U.S. Pat. No. 7,655,957 to Loh, et al., which is incorporated by reference herein.

In certain embodiments, lighting devices may include one or more lumiphoric material regions or discrete lumiphoric material-containing layers that are spatially segregated (e.g., remotely located) from electrically activated emitters, such as illustrated in FIGS. 5A-5B.

FIG. 5A illustrates a light emitting apparatus 500 including electrically activated solid state light emitters 501A, 501B mounted over a floor 551 of a reflector cup 554 defined in a body structure 550, with wirebonds 504 providing electrical communication with the solid state emitters 501A, 501B. A spacer layer 508 is arranged over the solid state light emitters 501A, 501B, with such spacer layer 508 including, for example, a clear encapsulant or a gap. An upper boundary 509 of the spacer layer 508 is overlaid with at least one lumiphoric material layer 510 containing one or more lumiphoric materials, which may be optionally further overlaid with an upper encapsulant and/or lens material (not shown). The lumiphoric material layer 510 is spatially separated from the solid state emitters 501A, 501B by the intervening spacer layer 508. One advantage of separating lumiphoric material from solid state light emitters is that conductive heating of the lumiphoric materials and/or associated encapsulant materials may be reduced.

FIG. 5B illustrates a light emitting apparatus 500' substantially similar to the device illustrated in FIG. 5A, but with inclusion of first and second lumiphoric material layers 510', 520' separated by an intervening layer 530' that may comprise a dichroic filter. The apparatus 500' including electrically activated solid state light emitters 501A', 501B' mounted over a floor 551' of a reflector cup 554' defined in a body structure 550', with wirebonds 504' providing electrical communication with the solid state emitters 501A', 501B'. A spacer layer 508' is arranged over the solid state light emitters 501A', 501B', with such spacer layer 508' including, for example, a clear encapsulant or a gap. An upper boundary 509' of the spacer layer 508' is overlaid with a first lumiphoric material layer 510' containing one or more lumiphoric materials (e.g., a red lumiphor material having a peak wavelength in a range of from 600 nm to 650 nm). An upper boundary 515' of the first lumiphor material layer 510' is adjacent to an intervening layer 530', which may comprise a dichroic filter that permits transmission of blue and green wavelengths but reflects wavelengths above the green or yellow spectral range. A second lumiphoric material layer 520' (e.g., a green lumiphoric material having a peak wavelength in a range of from 500 nm to 550 nm) may be arranged over the intervening layer 530', and an upper light-emitting surface 525'; of the second lumiphoric material layer 520' may be optionally further overlaid with an upper encapsulant and/or lens material (not shown). In certain embodiments, one or more lumiphoric material layers and/or dichroic filter may be associated with a lens and/or arranged outside of a reflector cup of a light emitter package.

FIG. 6A illustrates a light emitting apparatus 601 including a two-dimensional array of eight electrically activated solid state light emitters 604A-604H arranged on a submount 603 that may include an aluminum nitride layer 609, with the emitters 604A-604H arranged under a partially symmetric lens 607 that may be formed by overmolding on the submount 603 over the array of emitters 604A-604H. Further details of the device are illustrated in the following figures.

FIG. 6B is a perspective view of an alternative light emitting apparatus including a second multi-dimensional array of forty-eight electrically activated solid state light emitters including emitters 604A'-604X' of at least one first color (e.g., blue), and emitters 605A'-605X' 605B'-605X' of at least one second color (e.g., red) arranged under a partially symmetric lens 607. The differently colored emitters 604A'-604X', 605A'-605X' 605B'-605X' are interspersed with one another within the array to facilitate color mixing.

Light emitted by the apparatus 601 is directed to a preferential side due to presence of the partially symmetric lens 607. In FIG. 6A (and FIG. 6B for device 601'), light generated by the array of LEDs is directed into the page and to the right. Such preferential side-directing of light directing may be understood with reference to FIGS. 6C-6E. Device 601 includes an asymmetric lens 607. In FIG. 6C, direction of preferential-side illumination is toward the top of the figure; in FIG. 6E, direction of preferential-side illumination is to the right of the figure.

Preferential-side illumination is also achieved by the relative position of the array of LEDs 604A-604H and lens 607. FIG. 6C illustrates a centerline 625 (emitter axis) of the LED array and a lens centerline 623. As shown in FIG. 6C, the lens centerline 623 is offset from the LED array centerline 625 by an offset distance 627. In one embodiment, the offset distance 627 may be on the order of 0.24 mm for array dimensions 2.08 mm by 4.23 mm within submount dimensions 8.22 mm by 11.25 mm. Numerous other dimensions are possible.

FIG. 6F is a front (top) view of submount 603 of device 601 of FIG. 6A and device 601' of FIG. 6B, illustrating in particular the contact pad configuration. A contact layer 611 includes three different contact pads: a positive contact pad 611P, an intermediate contact pad 611I, and a negative contact pad 611N separated by gaps 610 to provide electrical isolation therebetween. In FIG. 6F (and in FIG. 6H) three vias 621V are shown for each polarity, connected to mounting pads 621P and 621N, respectively. Each contact pad 611P, 611I, 611N may be deposited onto the submount 603 by a metallization process. The geometric configuration of the three contact pads 611P, 611I, 611N is such that array of emitters 604A'-604X', 605A'-605X' can be conveniently laid out in a rectangular pattern such as shown in FIGS. 6A and 6B. Numerous other patterns are possible as are numerous other geometric configurations of the contact pads; configurations and patterns are not limited by the embodiments shown.

FIG. 6G is side (edge) view of submount 603, illustrating ceramic layer 609 on which contact pads 611P, 611I and 611N are deposited. FIG. 6H is a back (bottom) view of submount 603 illustrating mounting pads 621, 621P and 621N also deposited onto ceramic layer 609 by a metallization process. Mounting pads 621P and 621N are electrically connected to contact pads 611P and 611N, respectively, with metallized vias 621V that pass through the ceramic layer 609 thereby enabling mounting pads 621P and 621N to serve as electrical connections to a printed circuit board or other mounting structure for the lighting device 601. Mounting pad 621, which is electrically isolated from mounting pads 621P and 621N, provides a thermally conductive path for dissipation of heat from the submount 603.

Figure 6J:
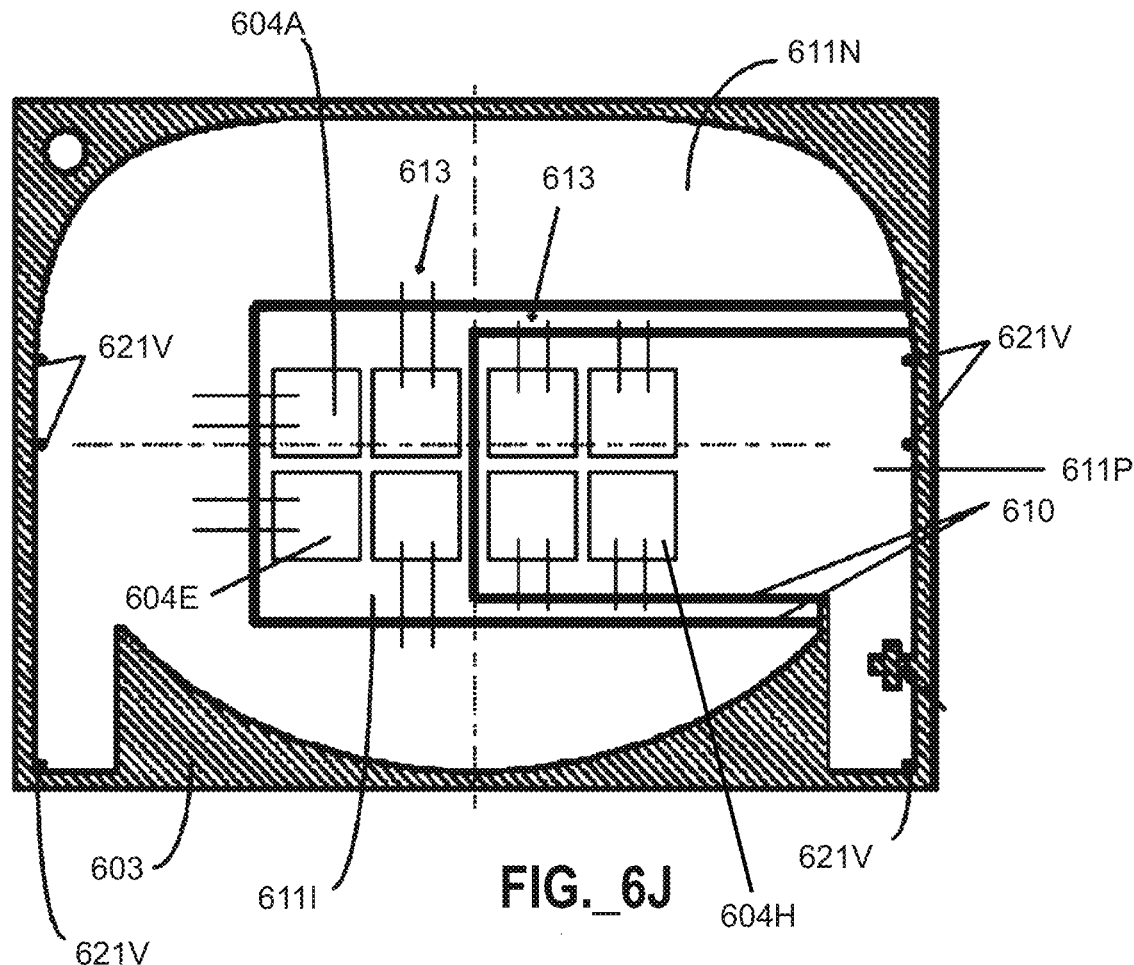
FIG. 6J is a top plan view of a subassembly of the light emitting apparatus of FIG. 6A including the submount of FIG. 6F with multiple solid state light emitters mounted thereon.
Figure 6I:
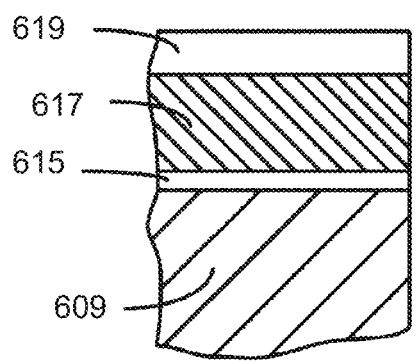
FIG. 6I is a side cross-sectional view of a portion of the submount of FIG. 6F.
Figure 13:
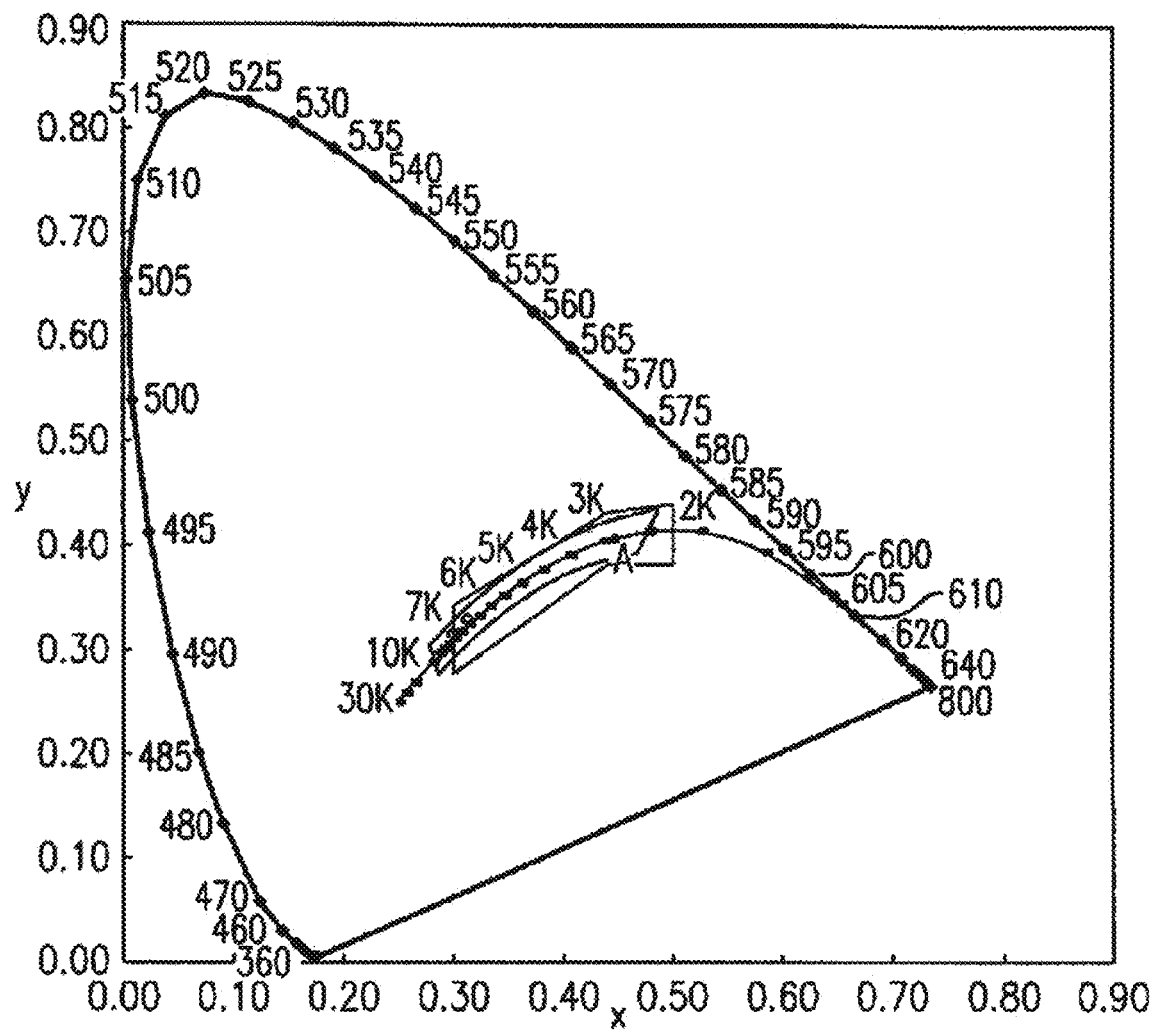
FIG. 13 is a 1931 CIE Chromaticity Diagram including representation of the blackbody locus, and further illustrating an approximately white area bounding the blackbody locus.

FIG. 6I is cross-sectional view of one (e.g., upper right) corner of the submount 603 of device 601. FIG. 6I illustrates contact pad metallization layers 615 (titanium layer), 617 (copper layer), and 619 (silver layer) on a portion of the aluminum nitride ceramic layer 609. Such layers are not illustrated to scale. Preferred approximate layer thicknesses may be as follows: aluminum ceramic layer 609: ~0.50 mm; titanium layer 615: ~0.06 microns; copper layer 617: ~50 microns; and silver layer 619: ~3.5 microns.

FIG. 6J is a top plan view of a subassembly of the light emitting apparatus 601 of FIG. 6A (including the submount of FIG. 6F) with multiple solid state light emitters 604A-604H mounted thereon. FIG. 6J illustrates LED array includes eight LEDs 604A-604H, including four LEDs bonded onto positive contact pad 611P and four LEDs bonded onto intermediate contact pad 611I. In this embodiment, LEDs 604A-604H are bonded onto the corresponding contact pads with the cathode side (n-type material) contacting the contact pads. The opposite sides of LEDs 604A-604H are the anode sides (p-type material) that are wirebonded to other contact pads to complete the electrical circuit within the apparatus 601.

Various light emitting apparatuses according to FIGS. 6A, 6C-6J were constructed and tested to permit comparison of various combinations of LEDs and phosphors, according to the following six configurations (labeled as "Cfg. 1" to "Cfg. 6" in FIGS. 7A-7D):

Configuration 1: eight SWB (450 nm dominant wavelength or DWL) LEDs arranged to stimulate yellow phosphor;

Configuration 2: two SWB (450 nm DWL) LEDs plus six LWB (465 nm DWL) LEDs all arranged to stimulate LuAg green phosphor (530 nm to 540 nm DWL) and red nitride phosphor (620 nm to 630 nm DWL);

Configuration 3: two SWB (450 nm DWL) LEDs plus six LWB (470 nm DWL) LEDs all arranged to stimulate green and red phosphors according to the prior configuration;

Configuration 4: four SWB (450 nm DWL) LEDs plus four LWB (465 nm DWL) LEDs all arranged to stimulate green and red phosphors according to the prior configuration;

Configuration 5: four SWB (450 nm DWL) LEDs plus four LWB (470 nm DWL) LEDs all arranged to stimulate green and red phosphors according to the prior configuration; and Configuration 6: six 460 nm dominant wavelength LEDs plus two LWB (470 nm DWL) LEDs all arranged to stimulate green and red phosphors according to the prior configuration.

Positions of the blue LEDs in the apparatuses according to Configurations 2-6 are illustrated in FIGS. 7F-7G, wherein FIG. 7F represents positions of LEDs according to Configurations 2, 3, and 6, and wherein FIG. 7F represents positions of LEDs according to Configurations 4 and 5.

Results of the testing of apparatuses according to the foregoing Configurations 1-6 are shown in FIG. 7A-7D, which embody charts of luminous flux variability, luminous efficacy variability, S/P ratio variability, and CRI variability, respectively.

As shown in FIGS. 7A-7B, apparatuses according to Configuration 1 provided the highest luminous flux and highest luminous efficacy, with steady declines in both luminous flux and luminous efficacy for apparatuses according to Configurations 2-6 with increasing presence of longer wavelength blue LEDs. FIG. 7A illustrates an arbitrary luminous flux target value of 1170 lumens, which was attained or exceeded only by apparatuses according to Configurations 1 and 2.

As shown in FIG. 7C, apparatuses according to Configuration 1 provided the lowest S/P ratio, with apparatuses according to Configurations 2-5 providing steady increases in S/P ration with increasing presence of longer wavelength blue LEDs. FIG. 7C illustrates an arbitrary S/P ratio value of 2.0, which was exceeded only by apparatuses according to Configurations 5 and 6.

As shown in FIG. 7D, apparatuses according to Configuration 1 provided very low CRI values in a range of 70-72, whereas apparatuses according to Configurations 2-6 all provided much higher CRI values in a range of between 86-90, with the highest CRI values attained by apparatuses according to Configuration 3.

Considering the parameters of luminous flux, luminous efficacy, S/P ratio, and CRI in combination, apparatuses according to Configurations 2-5 embody attractive balances in performance, with Configurations 2-3 exhibiting somewhat higher luminous flux and luminous efficacy, and with Configurations 4-5 exhibiting slightly somewhat higher S/P ratio values. Presence of SWB LEDs contributes luminous flux and luminous efficacy, and presence of LWB LEDs enhances S/P ratio.

FIG. 7E is a plot of chromaticity obtained by testing the light emitting apparatuses according to Configurations 4-5, with all values appearing in one of Cree bins 4A, 4B, 4C, 4D, 5A, or 5B proximate to the blackbody locus (wherein the sloping dividing line between bins 4A, 4B and bins 4C, 4D extends along a CCT of approximately 4500K, and wherein the sloping dividing line between bins 4C, 4D and bins 5B, 5A extends along a CCT of just below 4000K).

The results summarized in FIG. 7A-7E demonstrate that a lighting device including SWB and LWB LED arranged to stimulate emissions of red and green phosphors may provide aggregate emissions with high S/P ratio (e.g., at least 1.95) and favorably high color rendering values (e.g., at least 87.5) in combination with high brightness (e.g., in a range of at least 100-1100 lumens) and high luminous efficacy (e.g., greater than 115 lumens per watt).

FIG. 8A is a photograph depicting a solid state light emitting apparatus 820 including a solid state light emitter package 800 that includes multiple blue LEDs 813 and multiple red LEDs 815 arranged on a substrate 810 and not overlaid with lumiphoric material, all arranged under a unitary hemispherical lens 816, with the solid state emitter package 800 arranged on a star-shaped substrate 850 receiving two pairs of wires (conductors) 851 terminated at solder pads 855 permitting the red LEDs 815 to be controlled independently of the blue LEDs 813. The blue LEDs 813 are overlaid with green lumiphoric material, whereas the red LEDs 815 are not, with the LEDs 813, 815 fitting into a circular outline under the lens 816. As shown in FIG. 8A, the red LEDs 815 are arranged in one vertical line and two horizontal lines that cross the vertical line, thereby segregating the phosphor-covered blue LEDs 813 into six regions.

FIG. 8B is a simplified schematic view of a solid state light emitter package 800' similar to the package depicted in FIG. 8A, including blue LEDs 813' and 815' arranged on a substrate 810' within the circular outline of a hemispherical lens 816'. The red LEDs 815' are arranged in one vertical linear grouping 815-1 and two horizontal linear groupings 815-2, 815-3 that cross the vertical grouping 815-1, thereby segregating the phosphor-covered blue LEDs 813' into six regions 813-1 to 813-6. One advantage of the linear arrangement of the red LEDs 815' is facilitating easy masking (covering) of the red LEDs 815' to permit selective coating or deposition of lumiphoric material over the blue LEDs 813'.

Various light emitting apparatuses according to FIG. 8A were constructed including 452 nm dominant wavelength blue LEDs arranged to stimulate LuAG green phosphor material, and including red LEDs. Such devices were fabricated by mounting all LEDs to the substrate 810, underfilling with silicone between LEDs 813, 815, covering the red LEDs 815 with a stencil or mask, spray coating the blue LEDs 813 with 65 wt % LuAg phosphor in a silicone binder according to multiple passes, removing the stencil or mask from the red LEDs, and overmolding the substrate 810 with a lens 816. The blue and red LEDs 813, 815 were independently controllable using the two pairs of wires 851 and solder pads 855. Integrating sphere instant-on measurements at 25° C. were obtained by supplying current of 300 mA to the blue LEDs 813 and current of 190 mA to the red LEDs 815. Results of testing of three light emitting apparatuses are summarized in FIG. 8C, with the first two apparatuses having CCT values around 4150K, but with the third apparatus having a higher CCT of 5100K. All three apparatuses provided luminous flux (Lm) of 1055 lumens or greater, luminous efficacy (LPW) of 121 lm/W, luminous efficacy of radiation (LER) of at least 339 lumens per optical watt, and CRI of at least 89.2. Emissions of the first and second apparatuses embodied S/P ratio values of 1.99, whereas emissions of the third apparatus embodied a S/P ratio value of 1.96.

The results summarized in FIG. 8C demonstrate that a lighting device including blue shifted green LEDs and red LEDs may provide aggregate emissions with high S/P ratio (e.g., at least 1.95) and favorably high color rendering values (e.g., at least 89) in combination with high brightness (e.g., greater than 1000 lumens) and high luminous efficacy (e.g., greater than 120 lumens per watt).

FIG. 8D is a chart depicting superimposed spectral outputs of (A) simulation of a 452 nm peak wavelength blue LED, (B) simulation of LuAG phosphor, (C) simulation of red LED, and (D) testing results for the first light emitting apparatus (lamp no. 1) referenced in FIG. 8C and corresponding to the design of FIG. 8A. Although a lower S/P ratio (approximately 1.8) was expected from preliminary simulations, the experimentally obtained S/P ratio values were higher, likely due to reduced self-absorption of the phosphor for relatively low saturation.

A light emitting apparatus according to FIG. 8A was tested at two different temperatures to compare S/P characteristics. Integrating sphere instant-on measurements at temperatures of 25° C. and 85° C. were obtained by supplying current of 300 mA to the blue LEDs 813 and lower current the red LEDs 815, with results shown in FIGS. 8E-8F. Relative to 25° C. operation, both the blue LEDs 813 and red LEDs 815 shift to a longer wavelength (albeit with reduction of luminous flux from 1010 to 855 lumens) at 85° C., thereby increasing S/P ratio from 1.96 to 2.6, but also serving to increase correlated color temperature (CCT) from 4100K to 4200K while reducing CRI from 89.6 to 83.1. LER values also decreased from 342 to 316 lumens per optical watt at the increased temperature. Superimposed spectral outputs of the light emitting apparatus at two different temperatures (25° C. and at 85° C.) are depicted in FIG. 8F.

FIG. 9 illustrates a lighting apparatus (e.g., light fixture) 910 according to at least one embodiment. The apparatus 910 includes a substrate or mounting plate 975 to which multiple solid state emitter (e.g., LED) lamps 970-1 to 970-6 (with at least some lamps 970-1 to 970-6 optionally embodying a multi-chip lamp such as a multi-chip LED package) are attached. Although the mounting plate 975 is illustrated as having a circular shape, the mounting plate may be provided in any suitable shape or configuration (including non-planar and curvilinear configurations). With specific reference to a first solid state lamp 970-1, each solid state lamp 970-1 to 970-6 may include multiple solid state emitters (e.g., LEDs) 964A-964D preferably arranged on a single submount 961. Although FIG. 9 illustrates four solid state emitter chips as being associated with each multi-chip solid state lamp 970-1 to 970-6, it is to be appreciated that any suitable number of solid state emitter chips may be associated with each multi-chip solid state lamp 970-1 to 970-6, and the number of solid state emitter chips associated with different (e.g., multi-chip) solid state lamps may be different. Each solid state lamp in a single fixture 910 may be substantially identical to one another, or solid state lamps with different output characteristics may be intentionally provided in a single fixture 910. In certain embodiments, each solid state lamp 970-1 to 970-6 includes blue electrically activated solid state light emitters (optionally including short wavelength and long wavelength blue solid state emitters in combination) arranged to stimulate green lumiphors (e.g., with peak wavelengths of from 500 nm to 555 nm), with supplemental emissions by either red lumiphors and/or red solid state light emitters (e.g., with peak wavelengths of from 600 nm to 650 nm), with resulting aggregate emissions having with high S/P ratio (e.g., at least 1.95) and favorably high color rendering values, preferably in combination with high brightness and high luminous efficacy.

The solid state lamps 970-1 to 970-6 may be grouped on the mounting plate 975 in clusters or other arrangements so that the light fixture 910 outputs a desired pattern of light. The light fixture 910 may include one or more control circuit components 980 arranged to operate the solid state emitter lamps 970-1 to 970-6 by independently applying currents and/or adjusting duty cycle of respective LEDs or groups of LEDs. In certain embodiments, one or more individual solid state chips 964A-964D in various lamps 970-1 to 970-6 may be configured to be individually addressed by the control circuit 980. In certain embodiments, the control circuit components 980 may include at least one sensor. In certain embodiments, the lighting apparatus 910 may be self-ballasted. In certain embodiments, a control circuit 980 may include a current supply circuit configured to independently apply an on-state drive current to each individual solid state chip responsive to a control signal, and may include one or more control elements configured to selectively provide control signals to the current supply circuit, including but not limited to Pulse Width Modulation (PWM) signals. The control circuit 980 may be configured to control the current driven through the solid state emitter chips 964A-964D associated with the lamps 970-1 to 970-6 using one or more control schemes known in the art. The control circuit 980 may be attached to an opposite or back surface of the mounting plate 975, or may be provided in an enclosure or other structure (not shown) that is segregated from the light fixture 910. In certain embodiments, the lamps 970-1 to 970-6 may include temperature sensors (not shown) and may be individually temperature compensated. While not illustrated in FIG. 9, the light fixture 910 a may further include one or more heat spreading components and/or heatsinks for spreading and/or removing heat emitted by solid state emitter chips 964A-964D associated with the lamps 970-1 to 970-6. For example, a heat spreading component may include a sheet of thermally conductive material configured to conduct heat generated by the solid state emitter chips 964A-964D of the light fixture 910 and spread the conducted heat over the area of the mounting plate 975 to reduce thermal stratification in the light fixture 910. A heat spreading component may be embodied in a solid material, a honeycomb or other mesh material, an anisotropic thermally conductive material (e.g., graphite), one or more fins, and/or other materials or configurations.

FIG. 10 illustrates an interior lamp (e.g., desk lamp or table lamp) 1000 that may include multiple LEDs as described herein. The lamp 1000 includes an arm 1054 extending between a base 1051 and a lamp head 1060 that includes the LEDs 1068. The base 1051 may include a user input element 1052 and/or one or more sensor elements 1055 (e.g., photosensors) arranged to control operation (e.g., output intensity/dimming, and/or color point of aggregated emissions) of the LEDs 1068. In certain embodiments, the LEDs 1068 may include blue electrically activated solid state light emitters (optionally including short wavelength and long wavelength blue solid state emitters in combination) arranged to stimulate green lumiphors (e.g., with peak wavelengths of from 500 nm to 555 nm), with supplemental emissions by either red lumiphors and/or red solid state light emitters (e.g., with peak wavelengths of from 600 nm to 650 nm), with resulting aggregate emissions having with high S/P ratio (e.g., at least 1.95) and favorably high color rendering values, preferably in combination with high brightness and high luminous efficacy.

FIGS. 11A-11B illustrate an outdoor floodlight (e.g., street or roadway lamp) 1100 that may include multiple LEDs as described herein. The lamp 1100 includes a housing 1110 supported by an elongate pole 1101 or other support. Multiple LED modules 1131-1, 1131-2, 1131-3 each including multiple LEDs 1118A, 1118B (e.g., comprising individual LEDs and/or LED packages components as disclosed herein) may be arranged along a lower surface 1111 of the lamp 1100 between the pole 1101 and an end cap 1112. The LED modules 1131-1, 1131-2, 1131-3 are arranged proximate to an air gap 1114 permitting heat to be dissipated to a heat spreader or heat sink 1126 (arranged along the upper surface 1113) and transferred to an ambient environment. In certain embodiments, different LED modules and/or groups of LEDs therein may include separate (optionally different) optical components to provide any desired output beam pattern. In certain embodiments, the LED modules 1131-1, 1131-2, 1131-3 may include blue electrically activated solid state light emitters (optionally including short wavelength and long wavelength blue solid state emitters in combination) arranged to stimulate green lumiphors (e.g., with peak wavelengths of from 500 nm to 555 nm), with supplemental emissions by either red lumiphors and/or red solid state light emitters (e.g., with peak wavelengths of from 600 nm to 650 nm), with resulting aggregate emissions having with high S/P ratio (e.g., at least 1.95) and favorably high color rendering values, preferably in combination with high brightness and high luminous efficacy.

FIG. 12 is a simplified perspective view of a motor vehicle (i.e., automobile) 1200 including headlamps 1218-1, 1218-2 that may each include multiple LEDs as described herein for lighting an environment and/or surface external to the vehicle 1200, and including interior lamps 1228-1, 1228-2 that that may each include multiple LEDs as described herein for lighting the interior 1225 of the vehicle 1200. In certain embodiments, each headlamp 1218-1, 1218-2 and interior lamp 1228-1, 1228-2 may include blue electrically activated solid state light emitters (optionally including short wavelength and long wavelength blue solid state emitters in combination) arranged to stimulate green lumiphors (e.g., with peak wavelengths of from 500 nm to 555 nm), with supplemental emissions by either red lumiphors and/or red solid state light emitters (e.g., with peak wavelengths of from 600 nm to 650 nm), with resulting aggregate emissions having with high S/P ratio (e.g., at least 1.95) and favorably high color rendering values, preferably in combination with high brightness and high luminous efficacy.

Embodiments as disclosed herein may provide one or more of the following beneficial technical effects: permitting attainment of high S/P ratio and high CRI, preferably in combination with high brightness and high luminous efficacy, using a single lighting device; providing lighting devices with high luminous efficacy and enhanced energy efficiency; increasing light output useful to humans when an lighting apparatus is subject to dimmed operation; and enhancing flexibility of fabrication and operation of lighting devices.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Various combinations and sub-combinations of the structures described herein are contemplated and will be apparent to a skilled person having knowledge of this disclosure. Any of the various features and elements as disclosed herein may be combined with one or more other disclosed features and elements unless indicated to the contrary herein. Correspondingly, the invention as hereinafter claimed is intended to be broadly construed and interpreted, as including all such variations, modifications and alternative embodiments, within its scope and including equivalents of the claims.

What is claimed is:

1. A light emitting apparatus comprising:
   at least one first electrically activated solid state light emitter comprising a peak wavelength in a range of from 430 nm to 455 nm;
   at least one second electrically activated solid state light emitter comprising a peak wavelength in a range of from 456 nm to 469 nm;
   a first lumiphoric material comprising a peak wavelength in a range of from 600 nm to 650 nm and arranged to receive spectral output from the at least one first electrically activated solid state light emitter and the at least one second electrically activated solid state light emitter; and
   a second lumiphoric material comprising a peak wavelength in a range of from 500 nm to 555 nm and arranged to receive spectral output from the at least one first electrically activated solid state light emitter and the at least one second electrically activated solid state light emitter;
   wherein the light emitting apparatus is arranged to generate a spectral output including a ratio of scotopic to photopic light (S/P ratio) of at least 1.95.

2. A light emitting apparatus according to claim 1, being devoid of any electrically activated solid state light emitter comprising a peak wavelength in a range of from 470 nm to 599 nm.

3. A light emitting apparatus according to claim 1, wherein:
   the first lumiphoric material is arranged in a first layer over the at least one first electrically activated solid state light emitter and the at least one second electrically activated solid state light emitter;
   the second lumiphoric material is arranged in a second layer over the at least one first electrically activated solid state light emitter and the at least one second electrically activated solid state light emitter; and
   with respect to each of the at least one first electrically activated solid state light emitter and the at least one second electrically activated solid state light emitter, the first layer is arranged between (i) the second layer and (ii) the respective electrically activated solid state light emitter of the at least one first electrically activated solid state light emitter or the at least one second electrically activated solid state light emitter.

4. A light emitting apparatus according to claim 1, wherein the first lumiphoric material and the second material are blended with one another, and are arranged over each of the at least one first electrically activated solid state light emitter and the at least one second electrically activated solid state light emitter.

5. A light emitting apparatus according to claim 1, further comprising a third lumiphoric material comprising a peak wavelength in a range of from 550 nm to 580 nm and arranged to receive spectral output from at least one of the following elements (i) and (ii): (i) the at least one first electrically activated solid state light emitter, and (ii) the at least one second electrically activated solid state light emitter.

6. A light emitting apparatus according to claim 1, wherein the at least one first electrically activated solid state light emitter comprises a peak wavelength in a range of from 437 nm to 453 nm, and wherein the at least one second electrically activated solid state light emitter comprises a peak wavelength in a range of from 460 nm to 469 nm.

7. A light emitting apparatus according to claim 1, wherein each of the first lumiphoric material and the second lumiphoric material is spatially segregated from the at least one first electrically activated solid state light emitter and spatially segregated from the at least one second electrically activated solid state light emitter.

8. A light emitting apparatus according to claim 1, wherein the at least one first electrically activated solid state light emitter comprises a plurality of first electrically activated solid state light emitters, the at least one second electrically activated solid state light emitter comprises a plurality of second electrically activated solid state light emitters, and the number of first electrically activated solid state light emitters exceeds the number of second electrically activated solid state light emitters.

9. A light emitting apparatus according to claim 1, wherein the at least one first electrically activated solid state light emitter comprises a plurality of first electrically activated solid state light emitters, the at least one second electrically activated solid state light emitter comprises a plurality of second electrically activated solid state light emitters, and the first and second electrically activated solid state light emitters are arranged in a multi-dimensional array.

10. A light emitting apparatus according to claim 1, comprising at least one of the following features (a) to (d): (a) a single leadframe including multiple conductive leads arranged to supply current to the at least one first electrically activated solid state light emitter and the at least one second electrically activated solid state light emitter; (b) a single substrate arranged to structurally support the at least one first electrically activated solid state light emitter and the at least one second electrically activated solid state light emitter; (c) a single reflector arranged to reflect light emissions of the at least one first electrically activated solid state light emitter and the at least one second electrically activated solid state light emitter, and (d) a single lens arranged to transmit emissions of the at least one first electrically activated solid state light emitter and the at least one second electrically activated solid state light emitter.

11. A light emitting apparatus according to claim 1, wherein the spectral output comprises at least one of (i) luminous efficacy of at least 110 lumens per watt and (ii) a color rendering index ($R_A$) value of at least 85.

12. A light emitting apparatus comprising:
   at least one first electrically activated solid state light emitter comprising a peak wavelength in a range of from 430 nm to 479 nm;
   at least one second electrically activated solid state light emitter comprising a peak wavelength in a range of from 600 nm to 650 nm; and
   a first lumiphoric material comprising a peak wavelength in a range of from 500 nm to 555 nm and arranged to receive spectral output from the at least one first electrically activated solid state light emitter;
   wherein the at least one first electrically activated solid state light emitter is independently controllable relative to the at least one second electrically activated solid state light emitter; and
   wherein the light emitting apparatus is arranged to generate a spectral output including a ratio of scotopic to photopic light (S/P ratio) of at least 1.95.

13. A light emitting apparatus according to claim 12, wherein emissions of the at least one second electrically activated solid state light emitter are arranged to exit the light emitting apparatus without transit through the first lumiphoric material.

14. A light emitting apparatus according to claim 12, wherein the at least one first solid state emitter comprises at least one electrically activated solid state light emitter comprising a peak wavelength in a range of from 430 nm to 455 nm and comprises at least one electrically activated solid state light emitter comprising a peak wavelength in a range of from 456 nm to 479 nm.

15. A light emitting apparatus according to claim 12, wherein the first lumiphoric material is spatially segregated from the at least one first electrically activated solid state light emitter.

16. A light emitting apparatus according to claim 12, further comprising a second lumiphoric material comprising a peak wavelength in a range of from 550 nm to 580 nm and arranged to receive spectral output from the at least one first electrically activated solid state light emitter.

17. A light emitting apparatus according to claim 12, wherein the spectral output comprises at least one of (i) luminous efficacy of at least 110 lumens per watt and (ii) a color rendering index ($R_A$) value of at least 85.

18. A light emitting apparatus comprising:
   at least one first electrically activated solid state light emitter comprising a peak wavelength in a range of from 430 nm to 455 nm;
   at least one second electrically activated solid state light emitter comprising a peak wavelength in a range of from 456 nm to 469 nm;
   at least one third electrically activated solid state light emitter comprising a peak wavelength in a range of from 600 nm to 650 nm; and
   a first lumiphoric material comprising a peak wavelength in a range of from 500 nm to 555 nm and arranged to receive spectral output from the at least one first electrically activated solid state light emitter and the at least one second electrically activated solid state light emitter;
   wherein the light emitting apparatus is arranged to generate a spectral output including a ratio of scotopic to photopic light (S/P ratio) of at least 1.95.

19. A light emitting apparatus according to claim 18, wherein the light emitting apparatus is devoid of any electrically activated solid state light emitter comprising a peak wavelength in a range of from 470 nm to 599 nm.

20. A light emitting apparatus according to claim 18, wherein emissions of the at least one third electrically activated solid state light emitter are arranged to exit the light emitting apparatus without transit through the first lumiphoric material.

21. A light emitting apparatus according to claim 18, wherein the at least one third electrically activated solid state light emitter is independently controllable relative to the at least one first electrically activated solid state light emitter and the at least one second electrically activated solid state light emitter.

22. A light emitting apparatus according to claim 18, wherein the first lumiphoric material is spatially segregated from each of the at least one first electrically activated solid state light emitter and the at least one second electrically activated solid state light emitter.

23. A light emitting apparatus according to claim 18, further comprising a second lumiphoric material comprising a peak wavelength in a range of from 550 nm to 580 nm and arranged to receive spectral output from at least one of the following elements (i) and (ii): (i) the at least one first electrically activated solid state light emitter, and (ii) the at least one second electrically activated solid state light emitter.

24. A light emitting apparatus according to claim 18, wherein the spectral output comprises at least one of (i) luminous efficacy of at least 110 lumens per watt and (ii) a color rendering index ($R_A$) value of at least 85.

25. A method for fabricating a light emitting apparatus, the method comprising:
   mounting multiple solid state emitters to a common substrate or submount, wherein the multiple solid state emitters include at least one first electrically activated solid state light emitter comprising a peak wavelength in a range of from 430 nm to 479 nm, and at least one second electrically activated solid state light emitter comprising a peak wavelength in a range of from 600 nm to 650 nm;
   applying a stencil or mask over the at least one second electrically activated solid state light emitter;
   applying a first lumiphoric material over the at least one first electrically activated solid state light emitter; and
   removing the stencil or mask, thereby yielding a light emitting apparatus that includes the first lumiphoric material overlying the at least one first electrically activated solid state light emitter, but is devoid of first lumiphoric material over the at least one second electrically activated solid state light emitter.

26. A method according to claim 25, wherein the at least one first electrically activated solid state light emitter comprises at least one electrically activated solid state light emitter comprising a peak wavelength in a range of from 430 nm to 455 nm and comprises at least one electrically activated solid state light emitter comprising a peak wavelength in a range of from 456 nm to 479 nm.

* * * * *